(12) United States Patent
Lin et al.

(10) Patent No.: US 7,242,099 B2
(45) Date of Patent: Jul. 10, 2007

(54) CHIP PACKAGE WITH MULTIPLE CHIPS CONNECTED BY BUMPS

(75) Inventors: Shih-Hsiung Lin, Hsinchu (TW); Mou-Shiung Lin, Hsinchu (TW)

(73) Assignee: Megica Corporation, Hsinchu (TW)

( * ) Notice: Subject to any disclaimer, the term of this patent is extended or adjusted under 35 U.S.C. 154(b) by 74 days.

(21) Appl. No.: 10/695,630

(22) Filed: Oct. 27, 2003

(65) Prior Publication Data

US 2004/0126927 A1 Jul. 1, 2004

(30) Foreign Application Priority Data

Oct. 25, 2002 (TW) ............... 91125126 A

(51) Int. Cl.
*H01L 29/40* (2006.01)
*H01L 23/52* (2006.01)
*H01L 23/48* (2006.01)
*H05K 3/24* (2006.01)
*H05K 3/32* (2006.01)

(52) U.S. Cl. ............... 257/778; 257/E23.021; 257/E23.079; 257/E25.013; 257/E21.508; 257/E21.705; 257/784; 257/786; 257/737; 257/734; 257/738; 257/760; 257/758

(58) Field of Classification Search ........ 257/777, 257/686, 685, 723, 724, 728, 676, 784, 786, 257/775, 776, 758, 760, 737, 734, 738, E23.069, 257/E23.008, E23.067, E23.021, E25.013, 257/E23.097, E21.508, E21.705, 778
See application file for complete search history.

(56) References Cited

U.S. PATENT DOCUMENTS

| | | | | |
|---|---|---|---|---|
| 5,108,027 A | * | 4/1992 | Warner et al. | 228/254 |
| 5,251,806 A | | 10/1993 | Agarwala et al. | |
| 6,288,559 B1 | * | 9/2001 | Bernier et al. | 324/755 |
| 6,461,896 B1 | * | 10/2002 | Imasu et al. | 438/108 |
| 6,555,460 B2 | * | 4/2003 | Farnworth | 438/614 |
| 6,610,591 B1 | | 8/2003 | Jiang et al. | |
| 6,734,556 B2 | * | 5/2004 | Shibata | 257/737 |
| 6,762,122 B2 | | 7/2004 | Mis et al. | |
| 6,780,677 B2 | * | 8/2004 | Imasu et al. | 438/118 |
| 6,787,442 B2 | * | 9/2004 | Hayashida | 438/612 |
| 6,798,058 B1 | * | 9/2004 | Hashimoto | 257/693 |
| 6,815,545 B2 | | 11/2004 | Bucka et al. | |
| 6,875,638 B2 | * | 4/2005 | Yoneda et al. | 438/125 |
| 6,882,050 B2 | * | 4/2005 | Tanaka | 257/737 |
| 2002/0025655 A1 | * | 2/2002 | Satoh et al. | 438/460 |
| 2003/0022479 A1 | * | 1/2003 | Hayashida | 438/614 |
| 2003/0052409 A1 | * | 3/2003 | Matsuo et al. | 257/737 |
| 2005/0196907 A1 | * | 9/2005 | Ratificar et al. | 438/126 |
| 2006/0220259 A1 | | 10/2006 | Chen et al. | |

FOREIGN PATENT DOCUMENTS

JP 64-7638 * 1/1989
JP 8-148496 * 6/1996

* cited by examiner

Primary Examiner—Alexander Oscar Williams
(74) Attorney, Agent, or Firm—Winston Hsu

(57) ABSTRACT

A method of assembling chips. A first chip and a second chip are provided. At least one conductive pillar is formed on the first chip, and a conductive connecting material is formed on the conductive pillar. The second chip also comprises at least one conductive pillar. The first chip is connected to the second chip via the conductive pillars and the conductive connecting material.

82 Claims, 32 Drawing Sheets

CHIP PACKAGE WITH MULTIPLE CHIPS CONNECTED BY BUMPS

CROSS-REFERENCE TO RELATED APPLICATION

This application claims the priority benefit of Taiwan application serial no. 91125126, filed on Oct. 25, 2002. This application is related to application Ser. No. 09/798,654 flied on Mar. 5, 2001, now U.S. Pat. No. 6,818,545; and related to application Ser. No. 10/935,451 filed on Sep. 7, 2004, now pending; and related to application Ser. No. 09/953,525 filed on Sep. 17, 2001, now U.S. Pat. No. 6,642,136; and related to application Ser. No. 10/638,454 filed on Aug. 11, 2003, now Pat. No. 6,917,119; and related to application Ser. No. 11/120,234 tiled on May 2, 2005, now pending; and related to application Ser. No. 09/837,007 filed on Apr. 18, 2001, now pending; and related to application Ser. No. 10/055,580 filed on Jan. 22, 2002, now pending; and related to application Ser. No. 10/174,357 filed on Jun. 17, 2002, now U.S. Pat. No. 6,784,087; and related to application Ser. No. 10/874,704 filed on Oct. 27, 2003, now pending; and related to application Ser. No. 11/123,328 filed on May 6, 2005, now pending, all assigned to a common assignee.

BACKGROUND OF THE INVENTION

1. Field of the Invention

The invention relates in general to a method of assembling chips, and more particular, to a method of assembling chips with an enhanced packaging yield.

2. Related Art of the Invention

In the modem information explosive society, electronic products are everywhere in our daily lives. Accompanied with the continuously developed electronic technology, more complex and more humanized products are updated every single moment. The exterior design of the electronic products is also driven by the trend for being light, thin, short and small. For example, in the field of semiconductor package, many high-density semiconductor package techniques have been developed, such as the system in a package, the flip chip (F/C) structure, and the ball grid array (BGA).

Normally, the pattern of the systemized package structure includes multiple chips packaged in an encapsulating material. Such package structure has the advantages of short interconnection between chips and greatly reduced volume for wiring layout. However, there is some difficulty in the fabrication process thereof. For example, when two flip chips are connected to each other, misalignment problem frequently occurs as shown in FIGS. 1 to 5, which illustrate the flip chip connecting process.

In FIG. 1, first and second flip chips 110, 130 are provided. The first flip chip 110 has a first chip 112 and a first bump 122. The first chip has several first terminals 114 exposed at the surface of the first chip 112. Each of the first bumps 122 is positioned on the corresponding first terminal 114. The first bumps 122 are in ball patterns. The second flip chip 130 includes a second chip 132 and multiple second bumps 143. The second flip chip 130 further has multiple second terminals 134 exposed at the surface of the second chip 132. Each of the second bumps 142 is located on the corresponding second terminal 134. The second bumps 142 have ball shape.

The first chip and the second chip are then connected to each other. The first bumps 122 are dipped with flux 150 as shown in FIG. 2. The first flip chip 110 is then turned up side down, such that each first bump 122 is aligned and pressed on one corresponding second bump 142. Meanwhile, the joint between the first bump 122 and the second bump 142 is covered with the flux 150 as shown in FIG. 3. As both the first and second bumps 122 and 142 are in ball shape, a sliding motion between the first and second bumps 122 and 142 is inevitable when the first bumps 122 are pressed on the second bumps 142. Therefore, a displacement or shift between the first and second bumps 122 and 142 is caused.

A reflow process is then performed allowing each first bump 122 and the corresponding second bump 142 melted to form a common connecting block 160, while the flux 150 flows to an external surface of the connecting block 160 to cover the connecting block 160 as shown in FIG. 4. In case that a serious sliding motion occurs for pressing the first bumps 122 on the second bumps 142, the neighboring blocks 160 may contact each other during the reflow process. A short circuit is thus caused to reduce the package yield.

After the reflow process, a solution (not shown) is applied to remove the residual flux 150 on the blocks 160 to form the structure as shown in FIG. 5.

In the above bump-connecting process, the height of the connecting blocks 160 is limited, such that the distance between the first and second chip 112 and 132 is too small. In the following glue dispensing or encapsulating process, the encapsulating material (not shown) can hardly flowing between the first and second chips 112 and 132, such that void is formed therebetween, and the reliability of the package is degraded.

SUMMARY OF THE INVENTION

The present invention provides a method of assembling chips with greatly enhanced assemble reliability.

The present invention provides a method of assembling carriers between which the distance is increased.

Before a detailed description of the present invention, the space prepositions are first defined. The preposition "on" means the relative geometric relationship between two objects being or being not in contact with each other. For example, when A is on B, A can be disposed on B with or without a direct contact in between.

The method of assembling chips provided by the present invention comprises the following steps. A first chip and a second chip are provided. At least a conductive pillar is formed on the first chip, and at least a conductive connecting material is formed on the conductive pillar. The conductive connecting material is connected to the second chip, such that the first chip and the second chip are electrically connected to each other via the conductive pillar and the conductive connecting material. Thereby, in the connecting process, the conductive connecting material is carried on the second chip or the conductive connecting material on the second chip with a surface contact. The sliding motion between the conductive connecting material on the conductive pillar and the second chip or on the conductive connecting material of the second chip can be suppressed. The first and second chips can thus be connected with accurate alignment, and the short circuit effect between the connecting members is avoided.

The present invention provides a method of assembling carriers including the following steps. A first chip and a second chip are provided. At least a conductive pillar is formed on the first chip, and at least a conductive connecting material is formed on the second chip. The conductive pillar is connected to the conductive connecting material, such that the first carrier and the second carrier are electrically connected to each other via the conductive pillar and the conductive connecting material. Thereby, the conductive pillar is pressed on the conductive connecting material on the second chip with a surface contact, and the sliding motion between the conductive pillar and the conductive connecting material on the second chip is effectively avoided. The first and second chips can be properly aligned and connected. The short circuit can thus be prevented.

The present invention further provides a method of fabricating a multi-chip package module. A first chip, a second chip and a carrier are provided. Multiple conductive pillars are formed on the first chip, and a conductive connecting material is formed on the conductive pillars. The conductive pillars are connected to the second chip via the conductive connecting material, such that the second chip is attached to and electrical connected to the first chip via the conductive pillars and the conductive connecting material. The first chip is then mounted to and electrically connected to the carrier.

The present invention further provides a method of fabricating a multi-chip package module. A first chip, a second chip and a carrier are provided. Multiple conductive pillars are formed on the first chip, and a conductive connecting material is formed on the second chip. The conductive pillars are connected to the conductive connecting material, such that the second chip is attached to and electrical connected to the first chip via the conductive pillars and the conductive connecting material. The first chip is then mounted to and electrically connected to the carrier.

In one embodiment of the present invention, a multi-chip package module is provided. The package module includes a first chip, a second chip, multiple conductive pillars and a carrier. The conductive pillars are located between the first and second chips, while the first chip is mounted to the carrier and electrically connected thereto. The carrier includes a substrate, a ceramic substrate, or a leadframe.

An assembly structure is further provided in the present invention, including a first chip, a second chip and a conductive pillar located between the first and second chips.

Accordingly, as the melting point of the conductive pillar is configured higher than the connecting temperature of the conductive connecting material, such that the conductive pillar is not melted during the reflow process to maintain the space between the first and second chips. Therefore, a proper space between the first and second chips is sufficiently large, allowing the packaging material easily filled between the first and second chips in the following encapsulating process. In addition, a lead-free material can be used for forming the conductive pillar and the conductive connecting material to meet the environmental requirement.

BRIEF DESCRIPTION OF THE DRAWINGS

These, as well as other features of the present invention, will become more apparent upon reference to the drawings.

DETAILED DESCRIPTION OF THE PREFERRED EMBODIMENT

Figure 6:
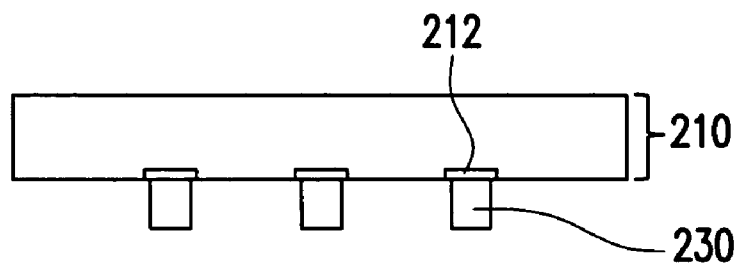
FIGS. 6 and 7 are cross sectional views showing the method of assembling carriers according to a first embodiment of the present invention.
Figure 7:
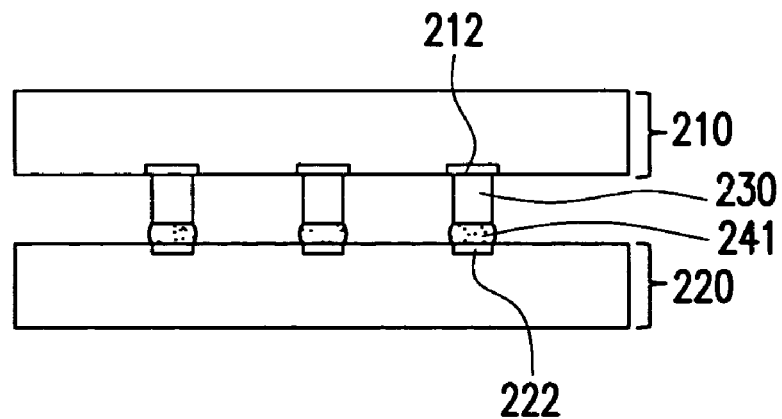

Referring to FIGS. 6 and 7, a cross sectional schematic view of a method for assembling carriers according to the first embodiment of the present invention is shown. As shown in FIG. 6, two carriers 210, 220, that is, the first and second carriers 210 and 220 are provided. The first carrier 210 has multiple terminals 212 exposed at a surface thereof. The second carrier 220 has multiple terminals 222 exposed at a surface thereof. The first and second carrier 210 and 220 each includes a chip, a substrate or a ceramic substrate.

Multiple conductive pillars 230 are formed on the terminals 212 of the first carrier 210, while a conductive connecting material 240 is formed on each of the terminals 222 of the second carrier 220. The material of the conductive pillars 230 is selected from tin, lead, copper, gold, silver, zinc, bismuth, magnesium, antimony, indium and an alloy thereof. The conductive connecting material 240 is in a paste form and can be formed by mixing metal particles and a flux. The conductive connecting material 240 can be formed on each terminal 222 of the second carrier 220 via screen printing. The metal particles include particles of tin, lead, copper, gold, silver, zinc, bismuth, magnesium, antimony, indium and an alloy thereof.

The first carrier 210 is flipped with each conductive pillar 230 facing and aligned with the conductive connecting material 240, such that each conductive pillar 230 is pressed on the conductive connecting material 240. A reflow process is performed allowing the metal particles of the conductive connecting material 240 melted and cured into a connecting block 241 to connect the conductive pillars 230 with the terminals 222 of the second carrier 220. The melting point of the conductive pillars 230 is higher than the fusion temperature of the conductive connecting material 240. In this embodiment, the connecting block is connected to only one side of the conductive pillars 230. The flux of the conductive connecting material 230 flows to a surface of the connecting block 241. A solution is used to remove the residual flux on the surface of the connecting block 241 to form the structure as shown in FIG. 7.

Figure 8A:
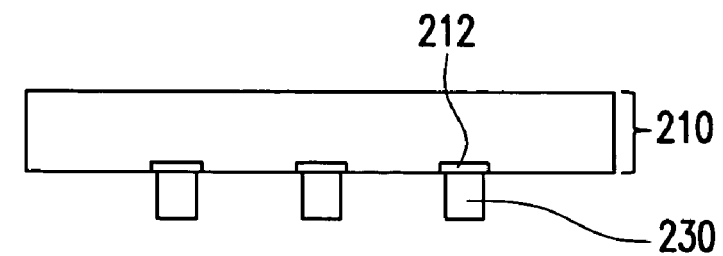
FIGS. 8A, 8B and 9 are cross sectional views showing the method of assembling carriers according to a second embodiment of the present invention.
Figure 8A:
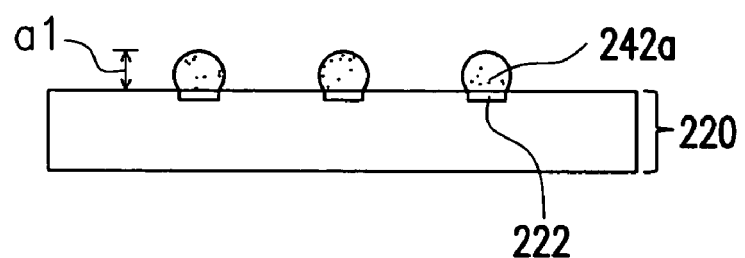
Figure 8B:
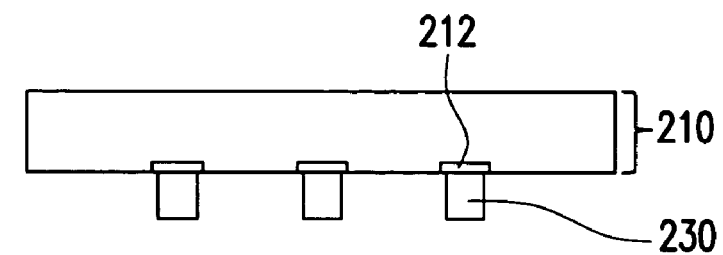
Figure 8B:
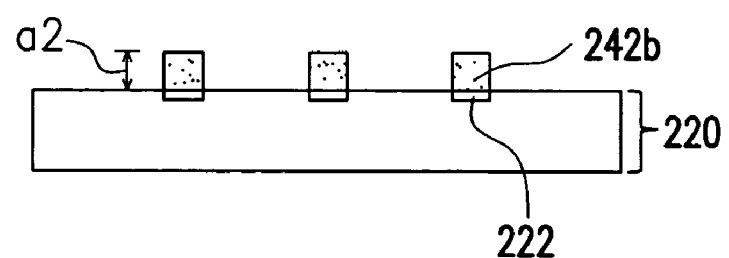
Figure 9:
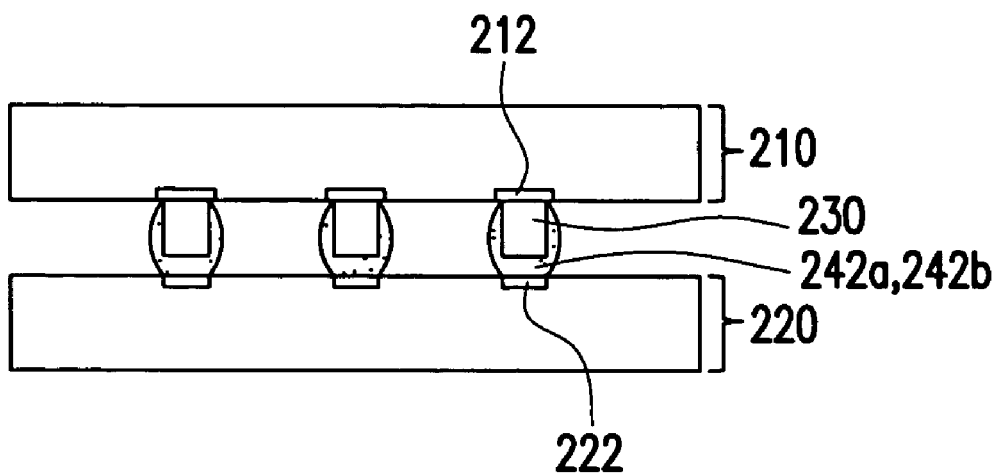

Referring to FIGS. 8A, 8B and 9, a method of connecting carriers in a second embodiment of the present invention is shown. The members denoted by the same numeral references in the first and second embodiments indicate the same devices, and an addition description is not further provided. Referring to FIGS. 8A and 8B, the conductive connecting materials 242a and 242b are in solid form such as pillar or ball (the conductive connecting material 242a is in a ball form in FIG. 8A and the conductive connecting material 242b is in a pillar form in FIG. 8B). The material of the conductive connecting materials 242a and 242b includes tin, lead, copper, gold, silver, zinc, bismuth, magnesium, antimony, indium or an alloy of the above materials. The melting point of the conductive pillar 230 is higher than the fusion temperature of the conductive connecting materials 242a and 242b. The conductive connecting material 242a are solder balls and the solder balls 242a have a ball height a1 greater than 15 μm. The conductive connecting material 242b is solder bumps and the solder bumps 242a have a bump height a2 greater than 15 μm.

The conductive pillars 230 are formed on the terminals 212 of the first carrier 210 and the conductive connecting materials 242a and 242b are formed on the terminals 222 of the second carrier 220. The conductive connecting materials 242a and 242b are dipped with a flux (not shown). The first carrier 210 is flipped to press each of the conductive pillars 230 to the corresponding conductive connecting materials 242a and 242b. A reflow process is performed to melt the conductive connecting materials 242a and 242b for covering the conductive pillars 230 as shown in FIG. 9. A solution is used to remove the flux remained on the conductive connecting materials 242a and 242b.

Figure 10:
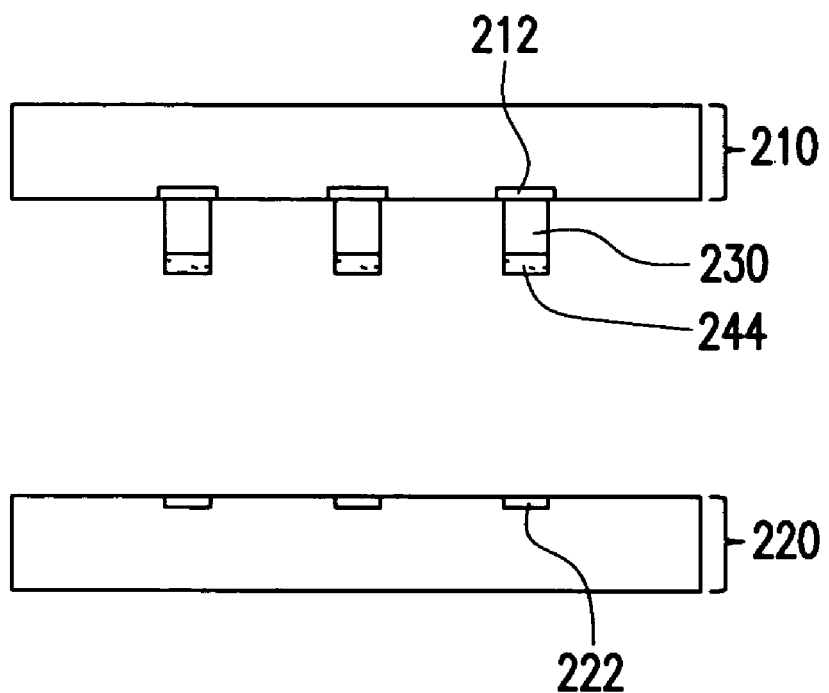
FIG. 10 is a cross sectional views showing the method of assembling carriers according to a third embodiment of the present invention.

FIG. 10 shows the method of assembling carriers according to a third embodiment of the present invention. The members denoted by the same numeral references in this and the first embodiments indicate the same devices, and an addition description is not further provided. In this embodiment, when the conductive pillars 230 are formed on the terminals 212 of the first carrier 210, the conductive connecting material 244 is formed on the conductive pillars 230. The conductive connecting material 244 is in solid form such as pillar or ball. The material of the conductive connecting material 244 includes tin, lead, copper, gold, silver, zinc, bismuth, magnesium, antimony, indium or an alloy of the above materials. The melting point of the conductive pillar 230 is higher than the fusion temperature of the conductive connecting material 244. The process of the conductive pillars 230 and the conductive connecting material 244 is incorporated by reference to Chinese Patent Application Nos. 90104979 and 91100092. After forming the conductive connecting material 244 on the conductive pillars 230, the first carrier 244 is turned up side down. A reflow process is performed to connect the conductive connecting material 244 with the terminal 222 of the second carrier 220. Thereby, the first and second carriers 210 and 220 are electrically connected via the conductive pillars 230 and the conductive connecting material 244. In addition, the paste-like conductive connecting material 230 can also be formed on the conductive pillar 230 by dipping adhesion. The paste-like conductive connecting material 230 includes a mixture of multiple metal particles and a flux. The metal particles include tin, lead, copper, gold, silver, zinc, bismuth, magnesium, antimony, indium or an alloy of the above metals.

Figure 11:
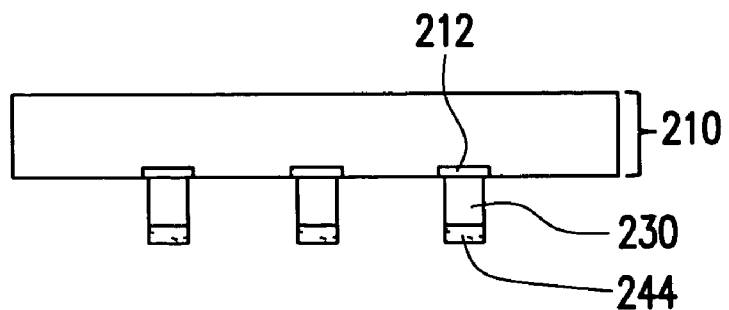
FIG. 11 is a cross sectional views showing the method of assembling carriers according to a fourth embodiment of the present invention.
Figure 11:
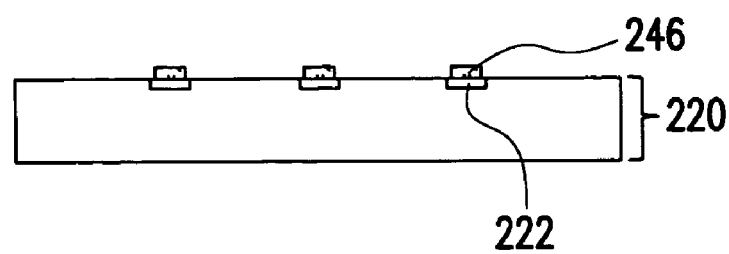

FIG. 11 shows the method of assembling carriers according to a fourth embodiment of the present invention. The members denoted by the same numeral references in this and the third embodiments indicate the same devices, and an addition description is not further provided. In this embodiment, before connecting the carriers, the conductive pillars 230 are formed on the terminals 212 of the first carrier 210, and the conductive connecting material 244 is formed on the conductive pillars 230. In addition, a conductive connecting material 246 is further formed on the terminals 222 of the second carrier 220. The conductive connecting material 246 includes paste mixed with metal particles and a flux. The conductive connecting material 246 can be formed on the terminals 222 of the second carrier 220 by screen-printing. The metal particles of the conductive connecting material 246 include tin, lead, copper, gold, silver, zinc, bismuth, magnesium, indium or an alloy of these materials. The first carrier 210 is then flipped, allowing the conductive pillars 230 aligned with the corresponding conductive connecting material 246. The conductive connecting material 244 on the conductive pillars 230 are then pressed on the conductive connecting material 246. A reflow process is performed, such that the metal particles in the conductive connecting material 246 are merged and cured with the conductive connecting material 244 to form a connecting block (not shown), while the flux of the conductive connecting material 246 flows to a surface of the connecting block. The connecting block can be merged at one side of the conductive pillars 230 or to cover the conductive pillars 230. A solution is used to remove the residual flux on the connecting block. By curing the conductive connecting material 244 and the metal particles in the conductive connecting material 246, the conductive pillars 230 can be connected to the terminals 222 of the second carrier 220. Preferably, the melting point of the conductive pillars 230 is higher than the fusion temperature of the conductive connecting materials 244 and 246.

Figure 12A:
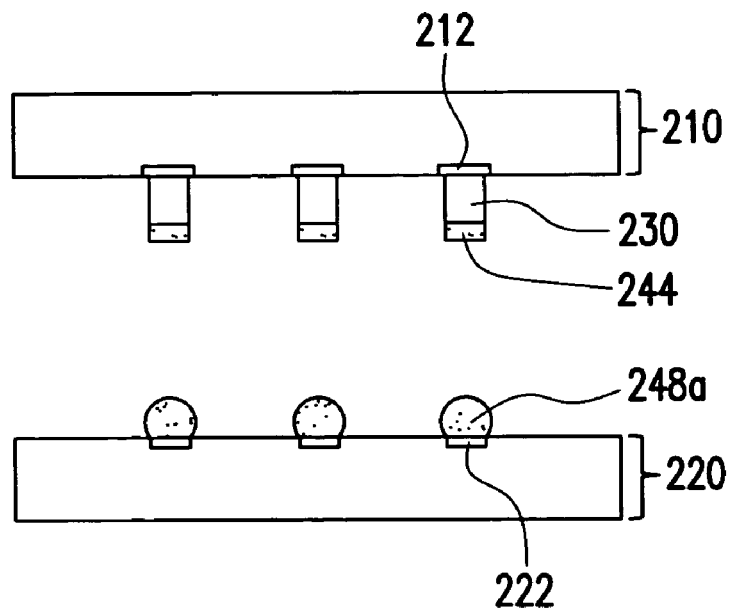
FIGS. 12A and 12B are cross sectional views showing the method of assembling carriers according to a fifth embodiment of the present invention.
Figure 12B:
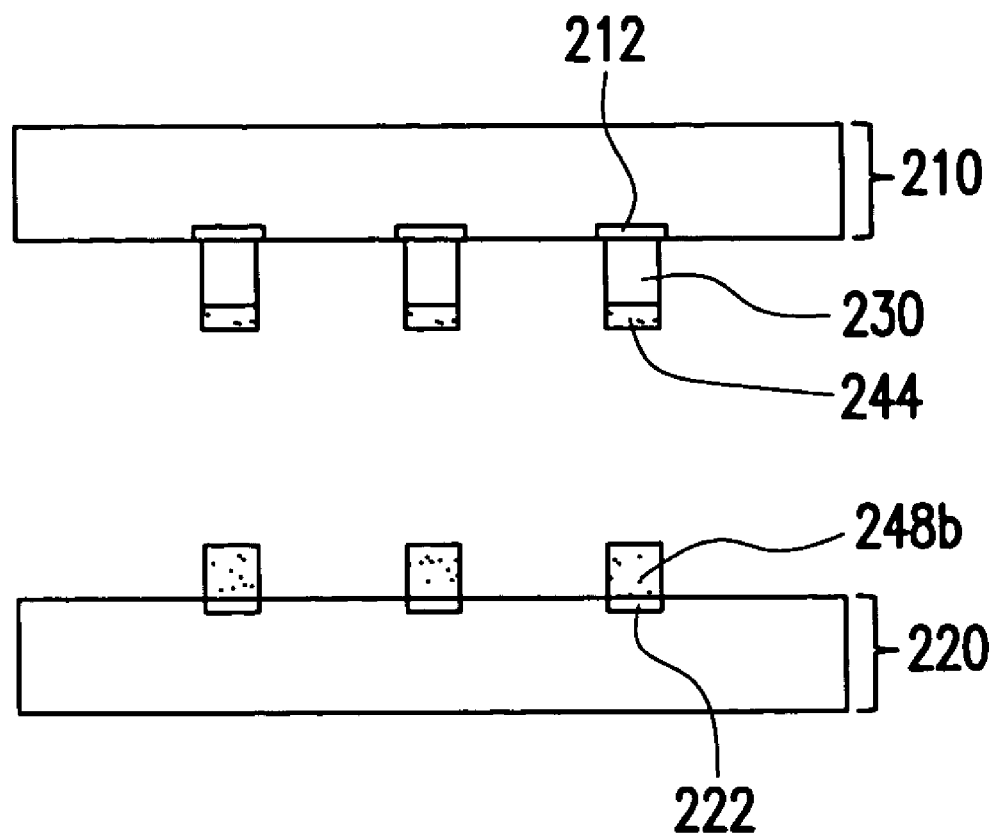

FIGS. 12A and 12B are cross sectional views showing the method of assembling carriers according to a fifth embodiment of the present invention. The members denoted by the same numeral references in this and the third embodiments indicate the same devices, and an addition description is not further provided. The conductive connecting materials 248a, 248b can be in solid form with pattern such as ball or pillar (the conductive connecting material 248a has a ball shape in FIG. 12A, and the conductive connecting material 248b has a pillar shape, as shown in FIG. 12B). The material of the conductive connecting materials 248a and 248b includes tin, lead, copper, gold, silver, zinc, bismuth, magnesium, antimony, indium, or an alloy thereof. Preferably, the melting point of the conductive pillars 230 is higher than the adhesion temperature between the conductive connecting materials 248a and 248b. When after the conductive pillars 230 are formed on the terminals 212 of the first carrier 210, the conductive connecting material 244 is formed on the conductive pillars 230, and the conductive connecting materials 248a and 248b are formed on the terminals 222 of the second carrier 220, the conductive connecting materials 248a and 248b are dipped with a flux. The first carrier 210 is flipped to press each conductive pillar 230 on the conductive connecting materials 248a and 248b. A reflow process is then performed to merge the conductive connecting materials 248a, 248b with the conductive connecting material 244 to form a connecting block (not shown). The connecting block can be formed at one side of the conductive pillars or to cover the conductive pillars. A solution is then used to remove the residual flux on the connecting block.

According to the above, as the melting point of the conductive pillar is higher than the fusion temperature of the conductive connecting material, such that the conductive pillar will not be melted in the reflow process. A sufficient large distance between the first carrier and the second carrier can thus be maintained thereby. Therefore, in the subsequent encapsulating process, the encapsulating material is easily to fill between the first and second carriers.

Figure 1:
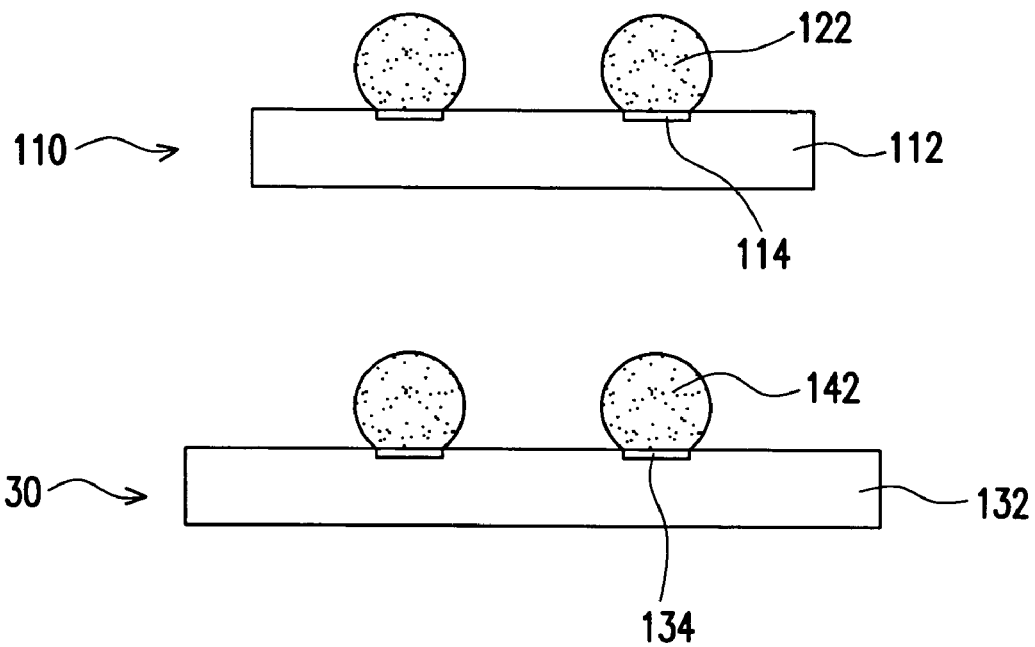
FIGS. 1 to 5 are cross sectional views showing the connecting process of flip chips.
Figure 2:
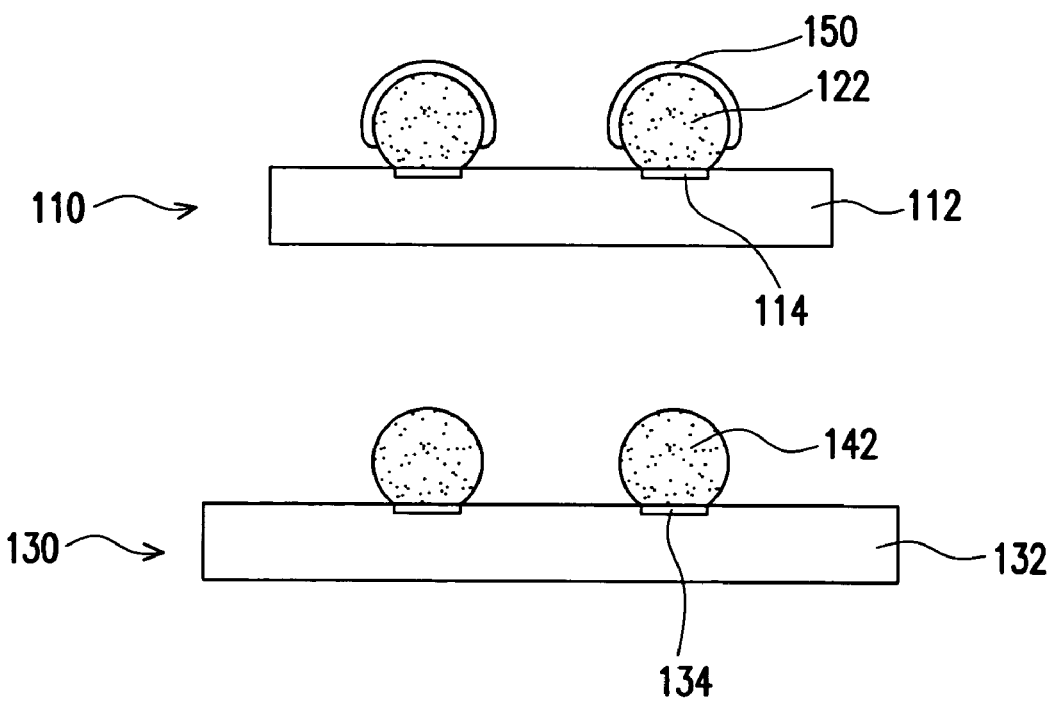
Figure 3:
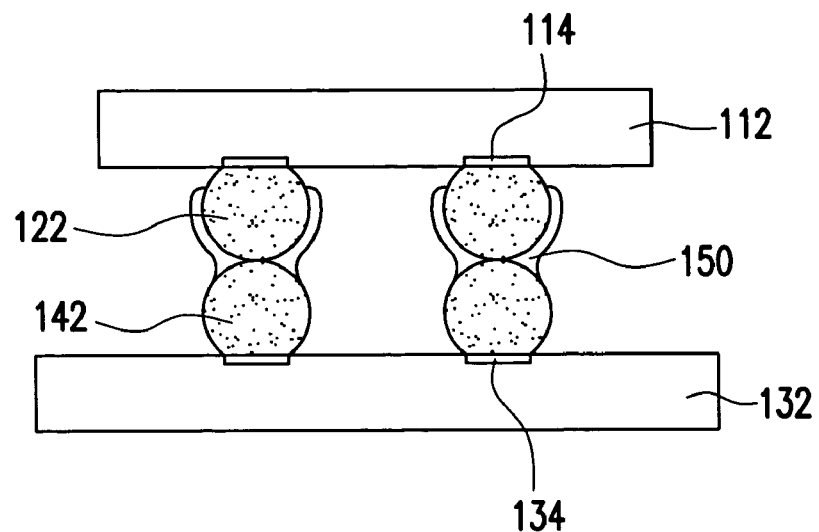
Figure 4:
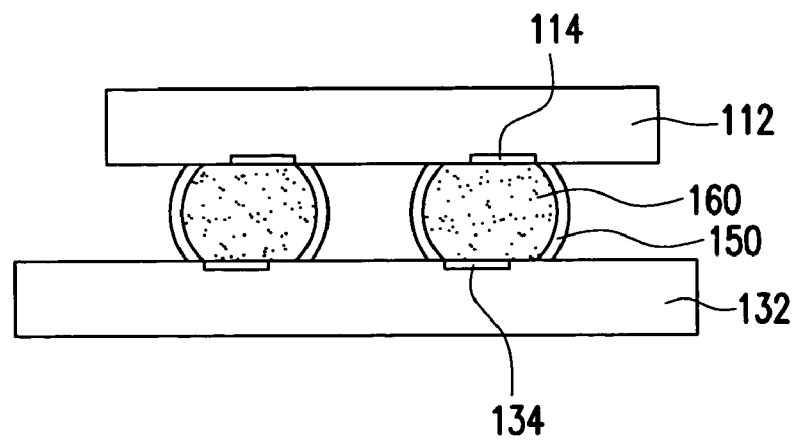
Figure 5:
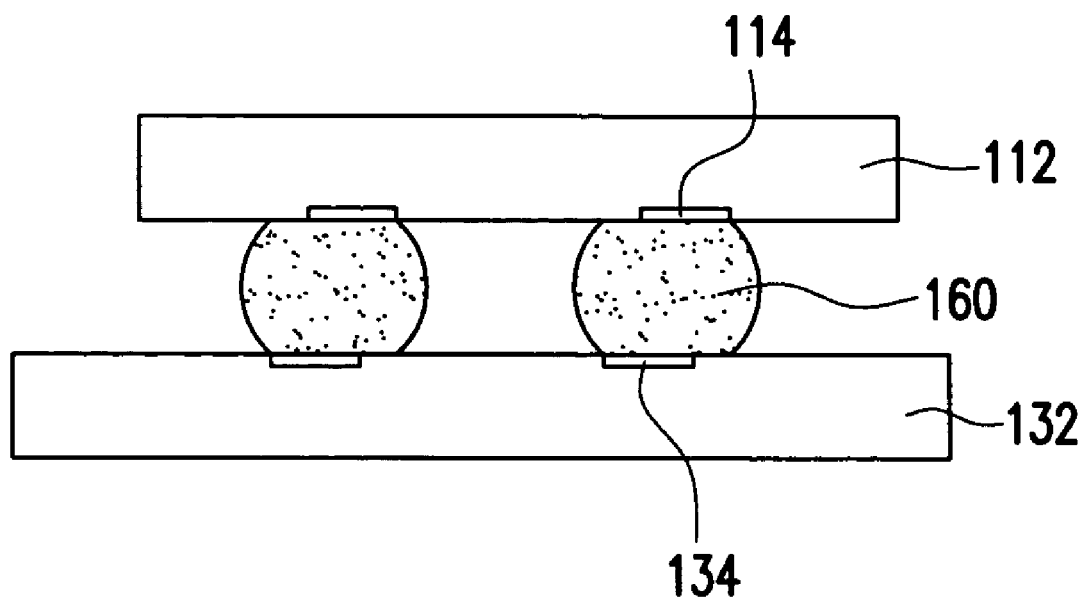
Figure 13:
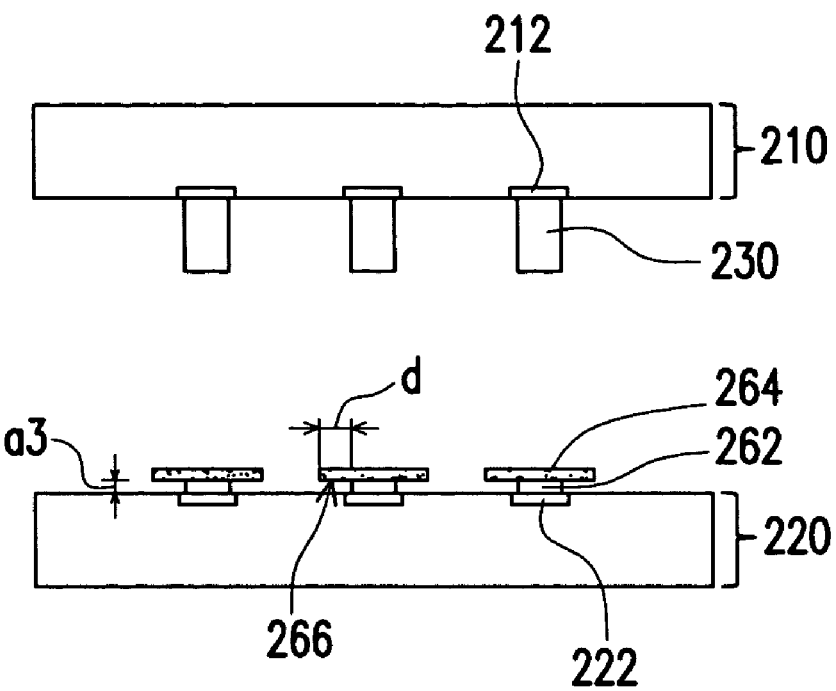
FIGS. 13 and 14 are cross sectional views showing a method of assembling carriers in a sixth embodiment of the present invention.
Figure 13A:
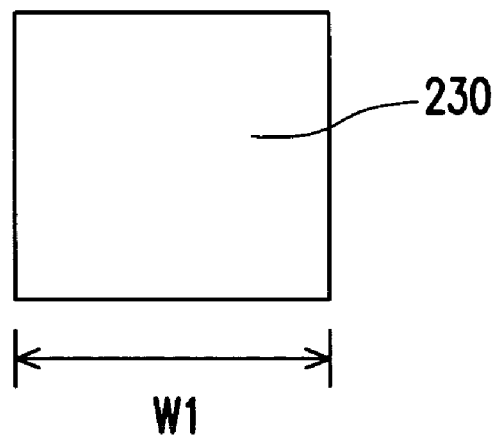
FIGS. 13A and 13B are laterally cross-sectional views showing conductive pillars 230 and 262 in a sixth embodiment of the present invention.
Figure 13B:
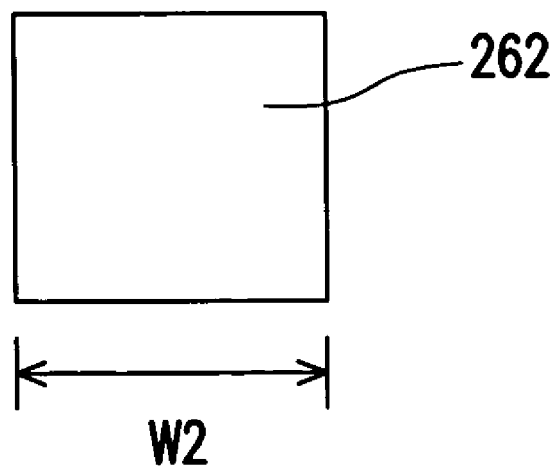
Figure 14:
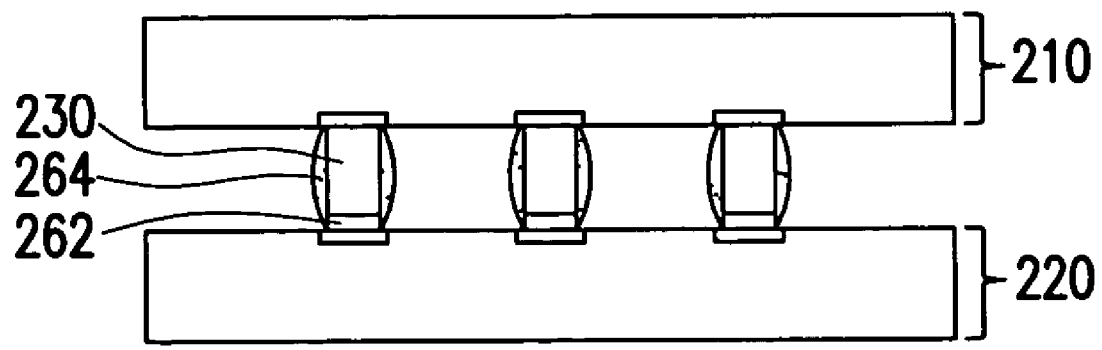

Referring to FIGS. 13 and 14, the method of assembling carriers in a sixth embodiment of the present invention is illustrated. Those denoted by the same reference numerals in FIG. 1 indicate the same devices or members and are not described again. After providing the first and second carriers 210 and 220, conductive pillars 230 are formed on each terminal 212 of the first carrier 210. The material of the conductive pillar 230 includes tin, lead, copper, gold, silver, zinc, bismuth, magnesium, antimony, indium or an alloy of the above materials. Conductive pillars 262 and a conductive connecting material 264 are further formed on each terminal 222 of the second carrier 220. The conductive pillars 262 are located on each terminal 222, while the conductive connecting material 264 is formed on the conductive pillars 262 and has a bottom surface 266 in contact with the conductive pillars 262. The materials of the conductive pillars 262 and the conductive connecting material 264 includes tin, lead, copper, gold, silver, zinc, bismuth, magnesium, antimony, indium or an alloy of the above materials. Further, the melting points of the conductive pillars 230 and 262 are higher than the temperature, and the conductive connecting material 264 extends beyond the conductive connecting material 264 with the bottom surface thereof exposed. Preferably, the cross section of the conductive pillars 262 is substantially the same as that of the conductive pillars 230. The minimum distance d between the edge of the conductive connecting material 264 and the edge of the conductive pillars 262 is no shorter than about 5 microns. Preferably, the height of the conductive pillars 230 is higher than that of the conductive pillars 262 and the height a3 of the conductive pillar 262 is smaller than 25 μm. The conductive pillars 230 and 262 have a cross section with the same shape and dimension. Alternatively, the conductive pillars 230 and 262 have a cross section with the substantially similar shape and substantially close dimension. The conductive pillars 230 and 262 have a laterally cross-section with square shaped, for example, and the substantially close dimensions w1 and w2 are within 10 μm per side, as shown in FIGS. 13A and 13B. Alternatively, the conductive pillars 230 and 262 have a laterally cross-section with circular shaped.

The conductive connecting material 264 is dipped with a flux and flipped to align each conductive pillar 230 with the conductive connecting material 264. The conductive pillars 230 are thus pressed on the conductive connecting material 264, and a reflow process is performed. The conductive connecting material 240 is thus in a fusion state to cover the conductive pillars 230 and 262 in a manner as shown in FIG. 14. A solution is then used to remove the flux remaining on the conductive connecting material 264.

Figure 15:
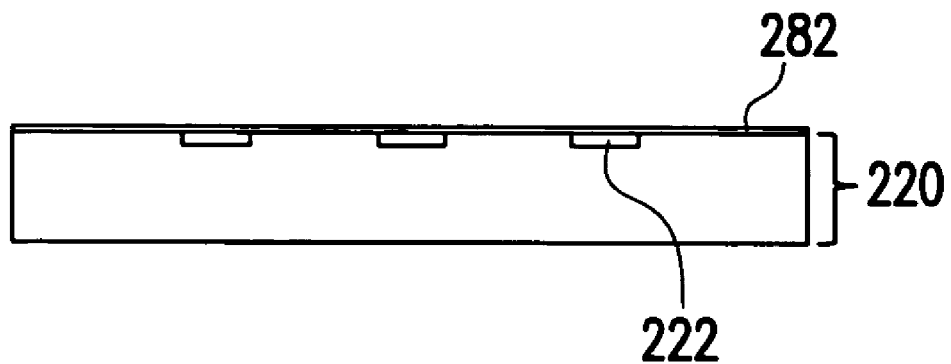
FIGS. 15 to 21 are cross sectional views showing the process of forming the conductive pillar and the conductive connecting material on the second carrier as shown in the sixth embodiment.

The fabrication method of the conductive pillars 262 and the conductive connecting material 264 is introduced as follows. In FIGS. 15 to 21, the sixth embodiment for forming the conductive pillars and the conductive connecting material on the second carrier is illustrated. Referring to FIG. 15, a second carrier 220 is provided, and a glue layer 282 is formed on the second carrier 220 by sputtering or evaporation. The material of the glue layer 282 includes titanium, titanium-tungsten alloy, titanium-nitrogen alloy or chromium.

Figure 16:
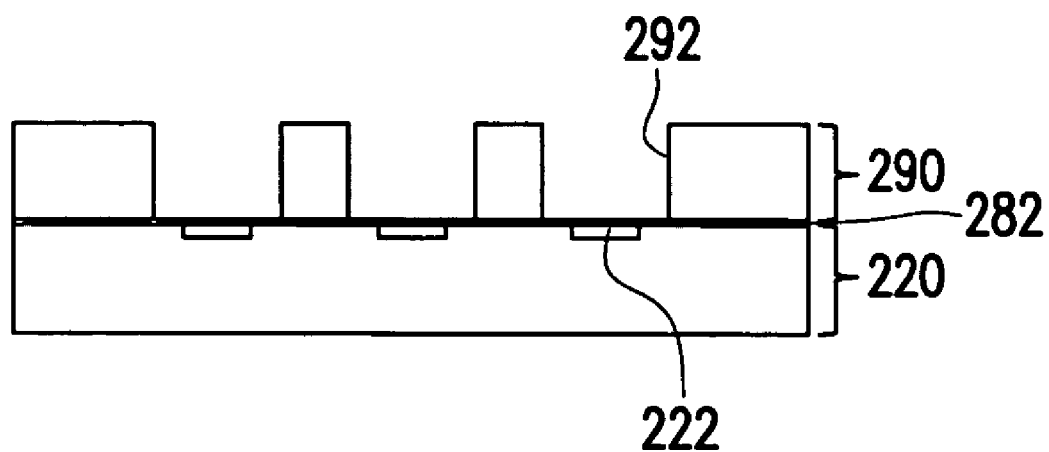
Figure 17:
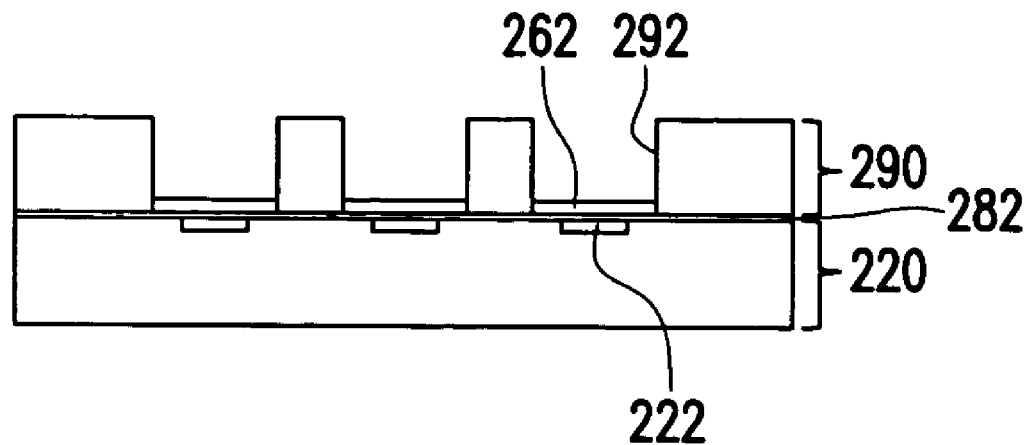
Figure 18:
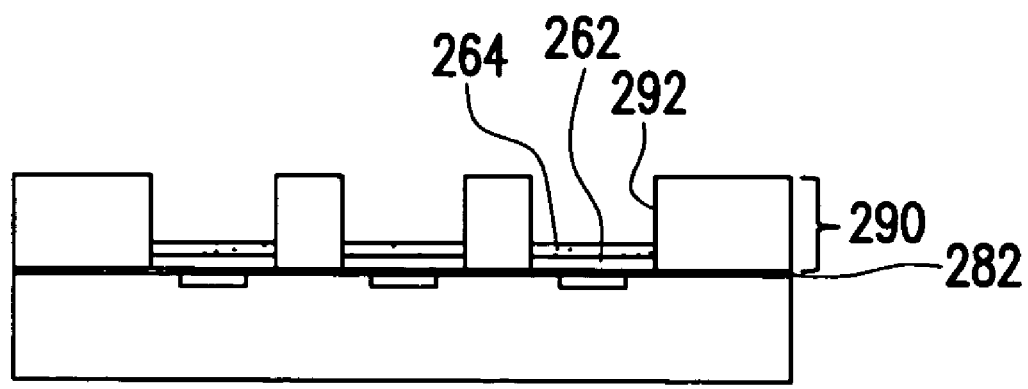
Figure 19:
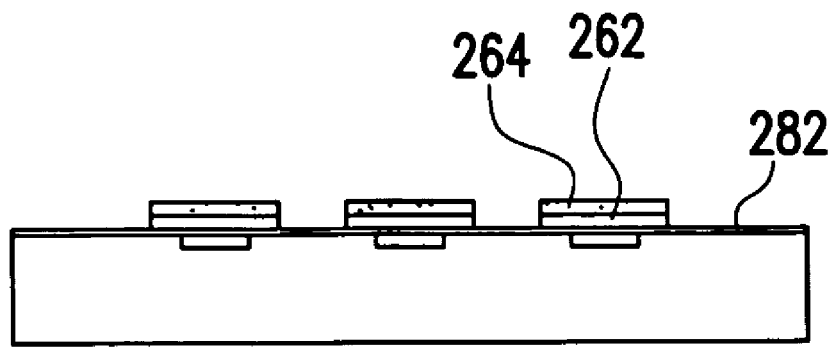

A photoresist layer 290 is formed on the glue layer 282 by adhesion or spin-coating. The exposure, development are then performed to transfer a pattern to the photoresist layer 290, which then comprises a plurality of openings 292 exposing the glue layer 282 over the terminals 222 of the second carrier 220 as shown in FIG. 16. Using electroplating, a conductive pillar 262 is formed in each opening 292 of the photoresist layer 290 and located on the glue layer 220 exposed thereby to form the pattern as shown in FIG. 17. The material for forming the conductive pillars 262 includes tin, lead, copper, gold, silver, zinc, bismuth, magnesium, antimony, indium or an alloy of the above materials. By electroplating, the conductive connecting material 264 is formed in the openings 292 of the photoresist layer 290 and located on the conductive pillars 262 as shown in FIG. 18. The material for forming the conductive connecting material 264 includes tin, lead, copper, gold, silver, zinc, bismuth, magnesium, antimony, indium or an alloy of the above materials. Preferably, the melting point of the conductive pillars 262 is higher than the connecting temperature of the conductive connecting material 264. The photoresist layer 290 is then removed to expose the glue layer 282 as shown in FIG. 19.

Figure 20:
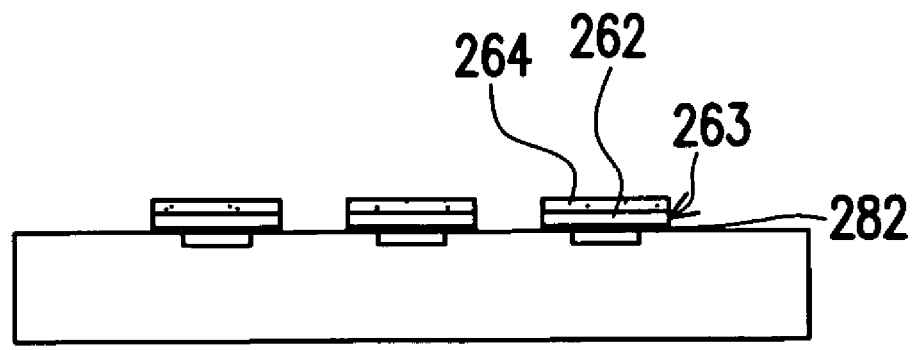
Figure 21:
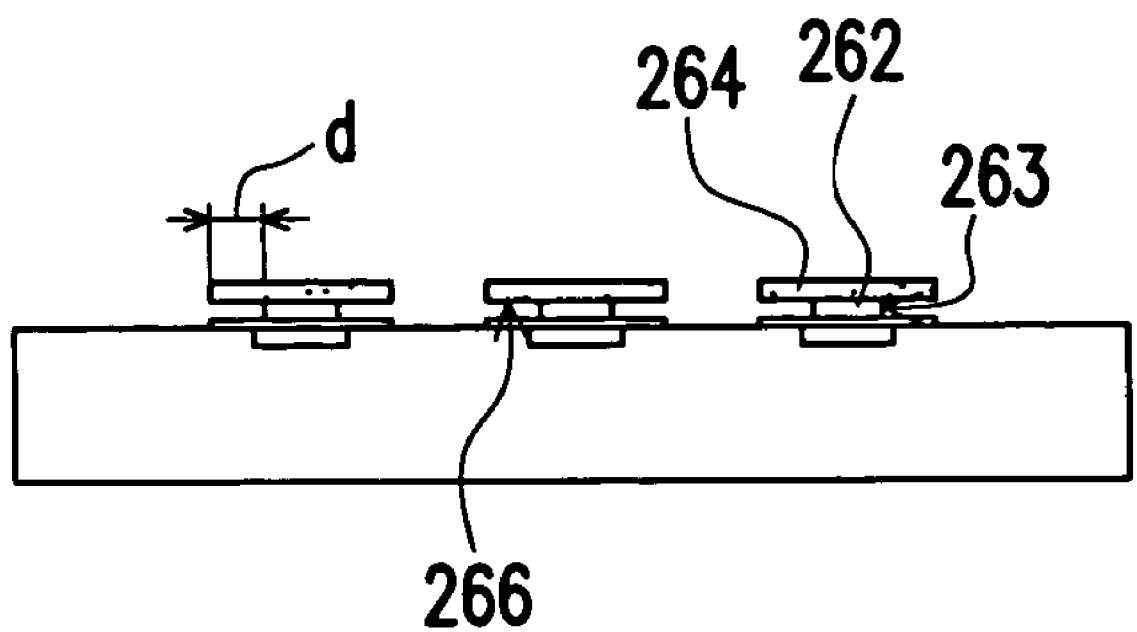

A wet etching process is then performed using the conductive pillars 262 and the conductive connecting material 264 as mask to remove the exposed glue layer 282 to form the structure as shown in FIG. 20. A wet etching process is further performed with the conductive connecting material 264 as a mask, so that the sidewall of the conductive pillars 262 are etched to result in reduction in cross section thereof. Consequently, the bottom surface 266 of the conductive connecting material 264 is exposed as shown in FIG. 21. The shortest distance between the edge of the conductive connecting material 264 and the edge of the conductive pillars 262 is no smaller than 5 microns.

Accordingly, as the melting point of the conductive pillars is higher than the connecting temperature of the conductive connecting material, the conductive pillars will not be fused during the reflow process to properly support the distance between the first and second carriers. Therefore, a sufficiently large space between the first and second carriers can be maintained, allowing the packaging material filled between the first and second carriers easily in the following encapsulating process.

In addition, during the connecting process, the conductive pillar is supported on the conductive connecting material of the second carrier with a surface contact, such that the sliding motion between the conductive pillar and the conductive connecting material of the second carrier can be suppressed. As a result, the first and second carriers can be connected with precise alignment to avoid the short circuit of the connecting structures.

During the connecting process, the conductive connecting material formed on the conductive pillar can be supported on the conductive connecting material formed on the second carrier with a surface contact. Therefore, the sliding motion between the conductive connecting material on the conductive pillars and the conductive connecting material on the second carrier is suppressed, so that the first and second carriers can be connected with a precise alignment to avoid short circuit.

Further, the conductive pillars and the conductive connecting material can be formed of unleaded material for environmental concern.

The package structure of the multi-chip package module fabricated by the above method is discussed as follows. FIGS. 13 to 20 show a cross sectional enlarged schematic drawing of a method for fabricating a multi-chip package module. The method described in any of the previous embodiments can be applied to connect chips and connecting the chip and substrate in this embodiment. In the following description, only one method is illustrated. The connecting structure between chips and between chip and substrate is similar to the connecting structure between carriers as discussed in the previous embodiment. Only one kind of structure is illustrated in the following figures.

The fabrication method of multi-chip package structure by applying the above connecting method between carriers is further described as follows. Referring to FIGS. 22 to 29, a first embodiment for fabricating a multi-chip module is illustrated. The method for connecting chip and substrate as mentioned above can be applied in this embodiment. In the following description, the method for connecting the carriers is not repeated.

Figure 22:
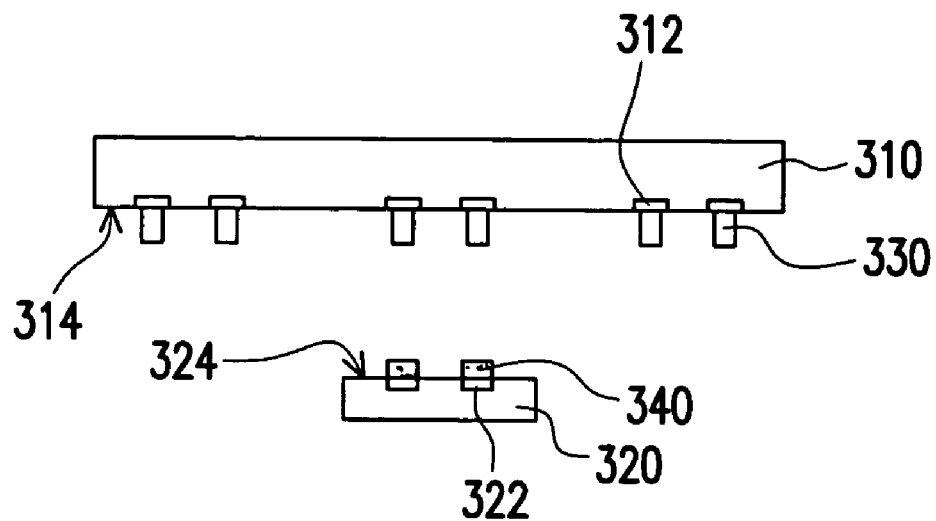
FIGS. 22 to 29 are cross sectional enlarged views showing a first example of fabricating a multi-chip package module according to the present invention.
Figure 23:
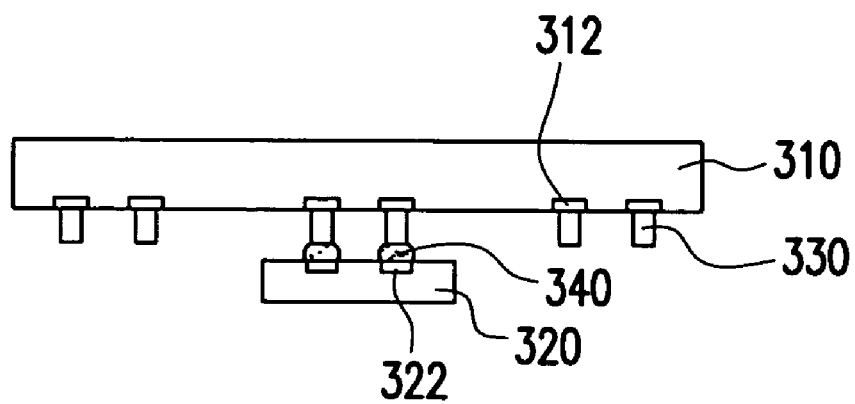

In FIG. 22, a first chip 310 and a second chip 320 are provided. The first chip 210 has multiple terminals 312 exposed at an active surface 314 of the first chip 310. The second chip has multiple terminals 322 exposed at an active surface 324 thereof. The first chip 310 includes digital logic chip, while the second chip 320 includes memory chip. Multiple conductive pillars 330 are formed on the terminals 312 of the first chip 310. A conductive connecting material 340 is formed on the terminals 322 of the second chip 320. The melting point of the conductive pillars 330 is higher than the fusion temperature of the conductive connecting material 340.

A merging process between the chips is then performed. The merging process includes a reflow process, for example. The conductive connecting material 340 is merged with the conductive pillars 330 on the central portion of the first chip 310; thereby, the second chip 320 is fixed to the central portion of the first chip 310. The first and second chips 310 and 320 are thus electrically connected via the conductive pillars 330 and the conductive connecting material 340 as shown in FIG. 14.

Figure 24:
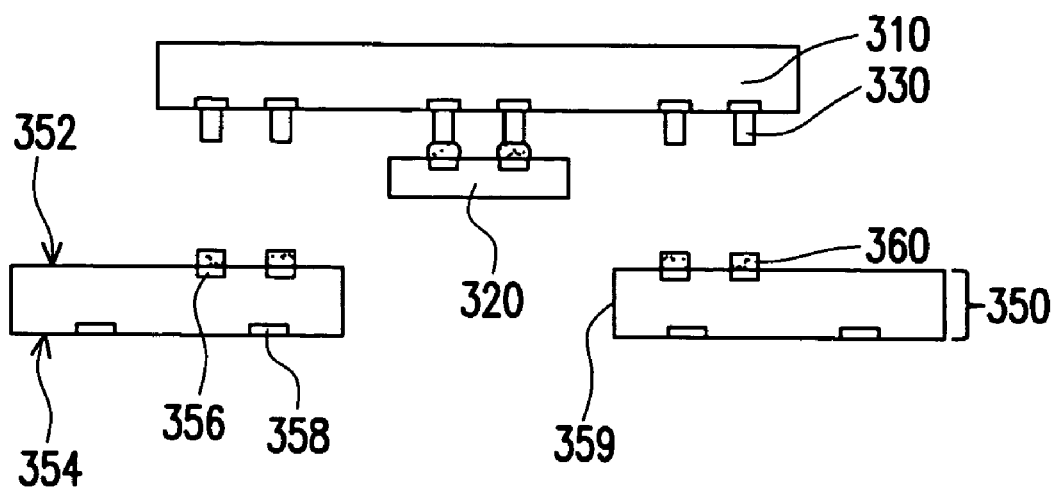

Referring to FIG. 24, a carrier 350 such as an organic, glass, ceramic or metal substrate is provided. The carrier 350 includes a surface 352 and a rear surface 354 opposing to the surface 352. The carrier 350 has a plurality of terminals 356 and 358 exposed at the surfaces 352 and 354, respectively. The carrier 350 further includes an opening 359 perforating through the center thereof. A conductive connecting material 360 is formed on the terminals 356 of the carrier 350. The melting point of the conductive pillars 330 is higher than the fusion temperature of the conductive connecting material 360.

Figure 25:
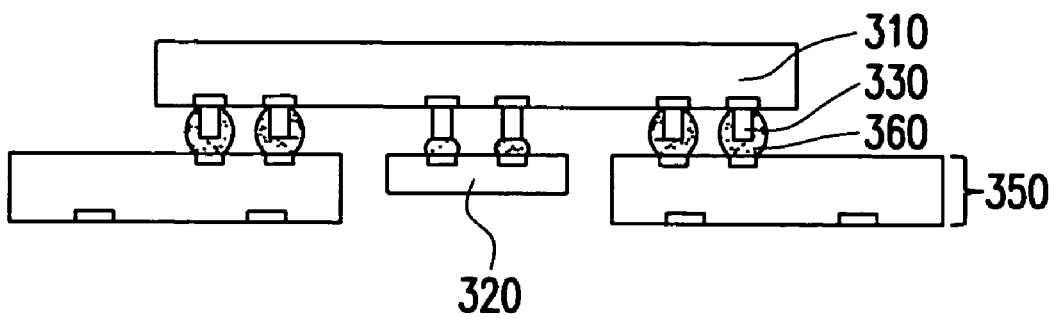

The connecting process between the chip and the substrate is then performed. For example, a reflow process is performed to merge the conductive connecting material 360 and the conductive pillars 330 located at a periphery of the first chip 310, such that the first chip can be mounted to the carrier 350. Meanwhile, the second chip 320 is accommodated in the opening 359. Via the conductive pillars 330 formed at the periphery of the first chip 310 and the conductive connecting material 360, the first chip 310 is electrically connected to the carrier 350 as shown in FIG. 25.

Figure 26:
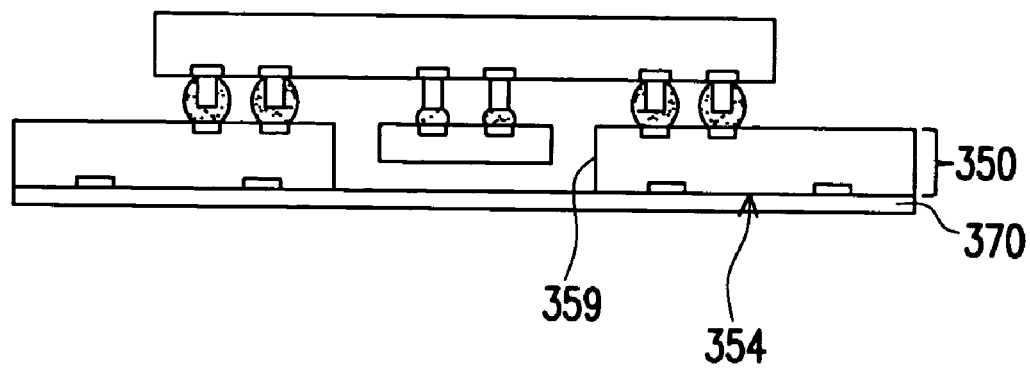
Figure 27:
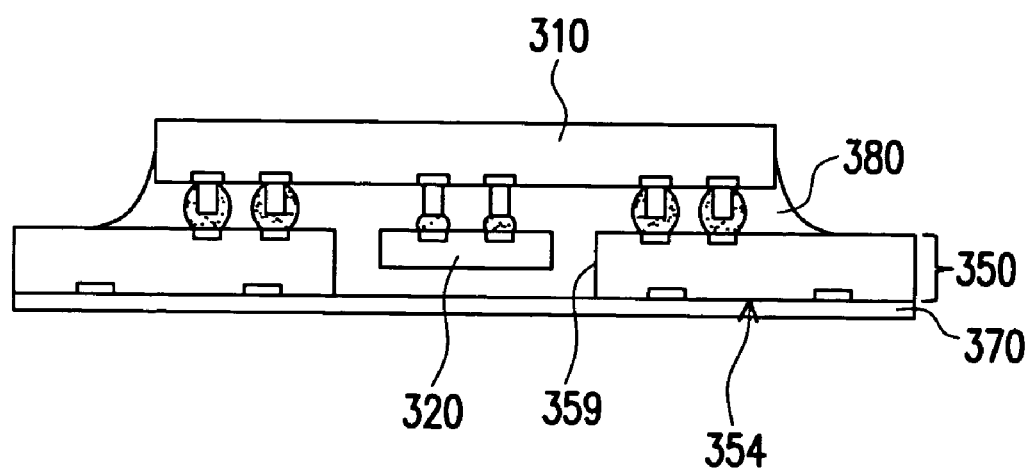
Figure 28:
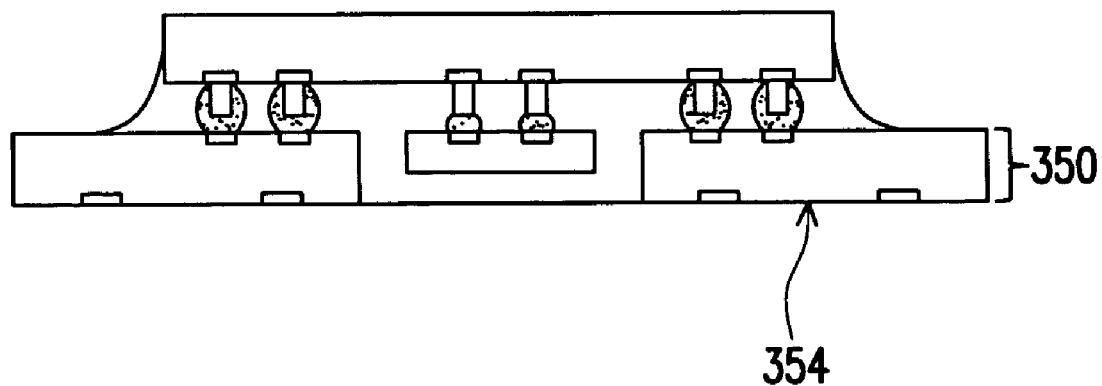
Figure 29:
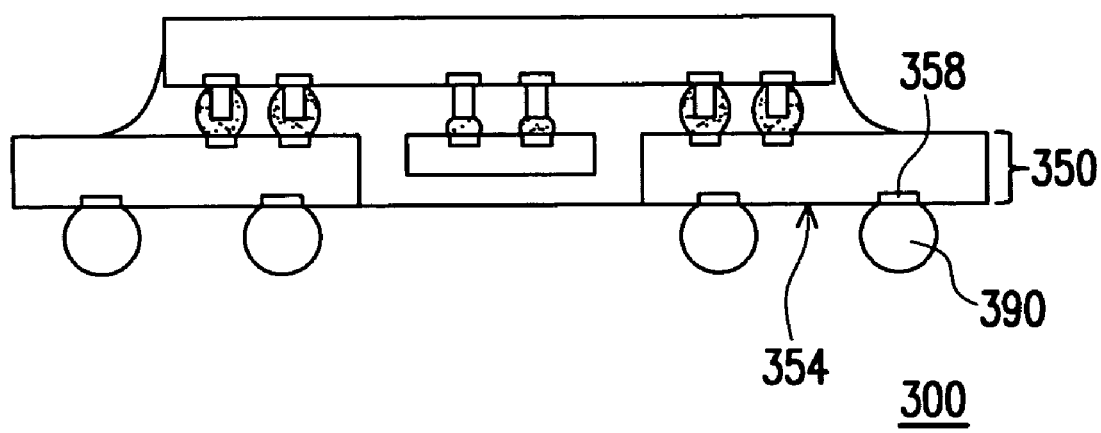

A film 370 can be adhered to the rear surface 354 to seal the opening 359 of the carrier 350 at the rear surface 354 as shown in FIG. 26. By glue dispensing, a first encapsulating material 380 is filled in the opening 359 of the carrier 350, and spaces between the first chip 310 and second chip 320 and between the first chip 310 and the carrier 350. The encapsulating material 380 covers the second chip 320 as shown in FIG. 27. The film 370 is then removed from the rear surface 354 of the carrier 350 to form the structure as shown in FIG. 28. By ball planting, a plurality of solder balls 390 are formed on the terminals 358 on the rear surface 354 of the carrier 350 as shown in FIG. 29. The multi-chip package module 300 is thus formed. The connection between the multi-chip package module 300 and an external circuit is established via the solder balls 390.

In the previous embodiment, the encapsulating material is filled in the opening, the spaces between the first and second chips, and between the first chip and the carrier using glue dispensing. However, the present invention is not limited to the method only. Other methods, such as those illustrated in FIGS. 30 to 32 which illustrate a second embodiment of multi-chip package module, can also be applied. The devices denoted with the same numeral references as the first embodiment indicated the same or the similar members. The description is not repeated hereinafter.

Figure 30:
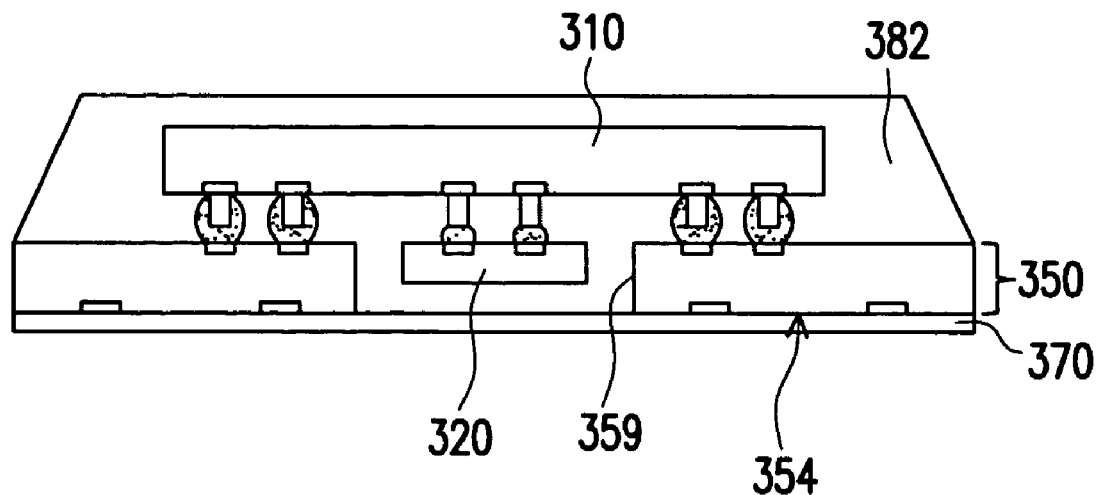
FIGS. 30 to 32 are cross sectional enlarged views showing a third example of fabricating a multi-chip package module according to the present invention.
Figure 31:
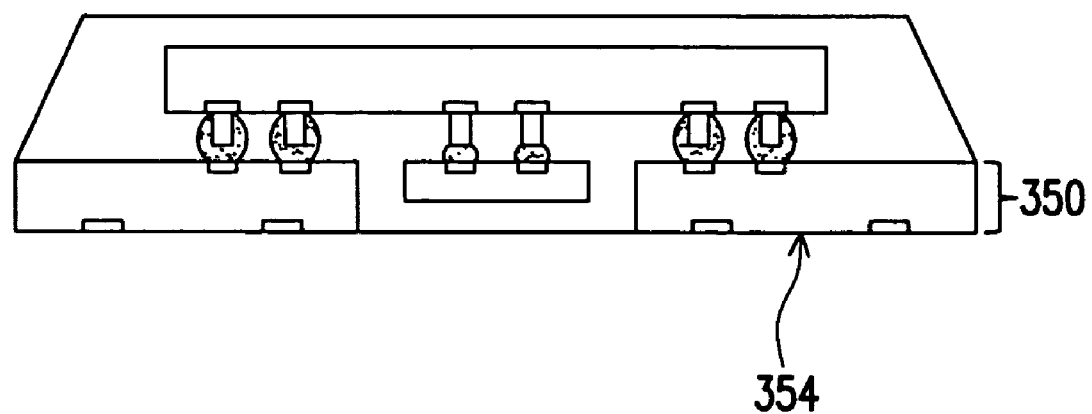
Figure 32:
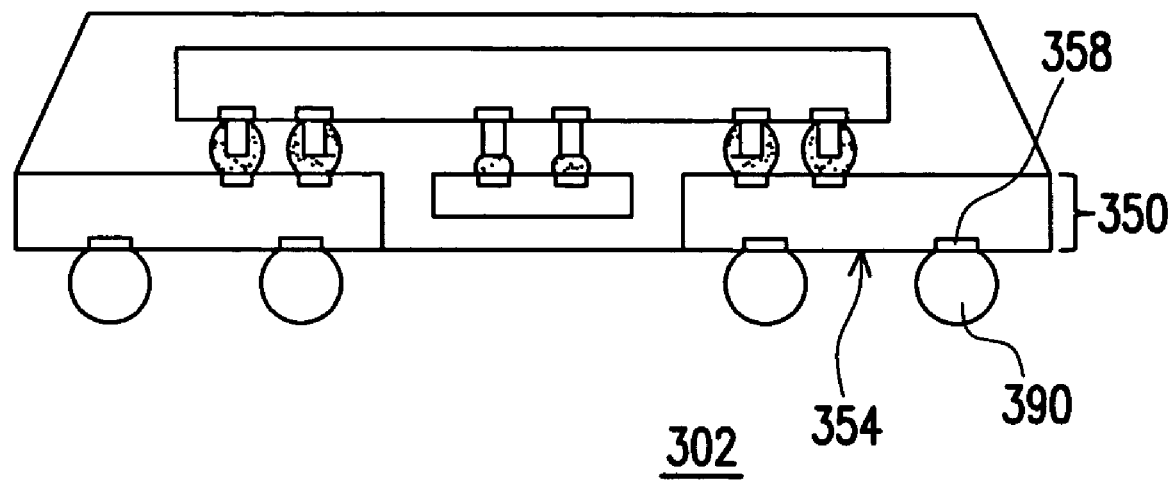

Referring to FIG. 30, following the process of the first embodiment, the film 370 is adhered to the rear surface 354 of the carrier 350. The first encapsulating material 382 is filled in the opening 359 of the carrier 350, the space between the chips 310 and 320, and the space between the first chip 310 and the carrier 350 using glue injection. Thereby, the first chip 310 and the second chip 320 are covered with the encapsulating material 380. The film 370 is then removed from the rear surface 354 of the carrier 350 to form the structure as shown in FIG. 31. A plurality of solder balls 390 are then formed on the terminals 358 on the rear surface 354 of the carrier 350 via ball planting to form the structure as shown in FIG. 32. Thereby, the multi-chip package module 302 is formed and the electric connection between the multi-chip package module 302 and an external circuit is established via the solder balls 390.

In the above embodiment, the first chip is connected to the carrier after the first chip and the second chip are connected to each other. It is appreciated that the present invention is not limited to such sequence only. The sequence of connecting the first chip and the second chip after mounting the first chip to the carrier can also be applied in the present invention. FIGS. 33 to 36 show a third embodiment of fabricating multi-chip package module according to such sequence. In FIGS. 24 to 27, the devices denoted by the same numeral references as the first embodiment indicate the same or similar devices.

Figure 33:
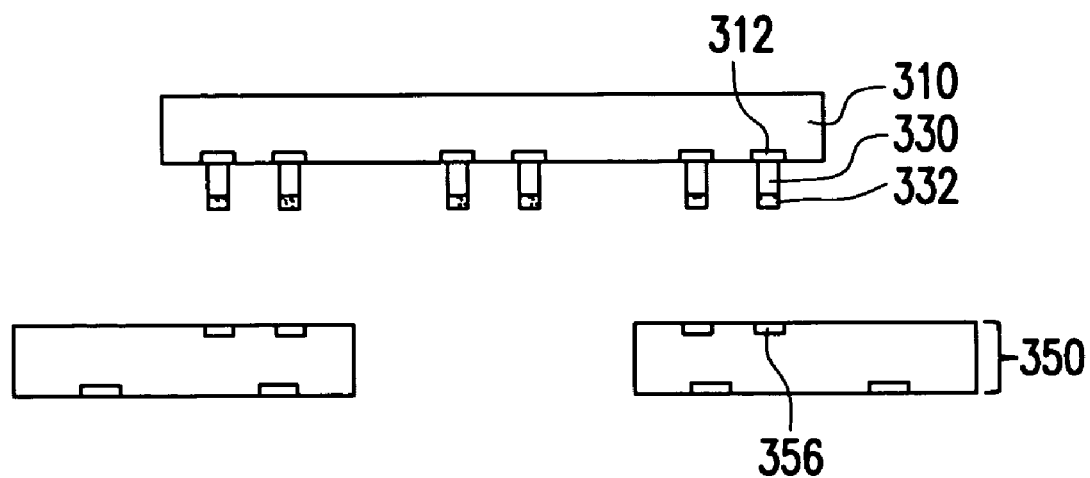
FIGS. 33 to 36 are cross sectional enlarged views showing a third example of fabricating a multi-chip package module according to the present invention.

Referring to FIG. 33, a first chip 310 and a carrier 350 are provided. Multiple conductive pillars 330 are formed on the terminals 312 of the first chip 310, and a conductive connecting material 332 is formed on the conductive pillars 330. The methods of fabricating the conductive pillars 330 and the conductive connecting material 332 are incorporated by reference to the Chinese Patent Application Nos. 90104979 and 91100092. The melting point of the conductive pillars 330 is higher than the fusion temperature of the conductive connecting material 332.

Figure 34:
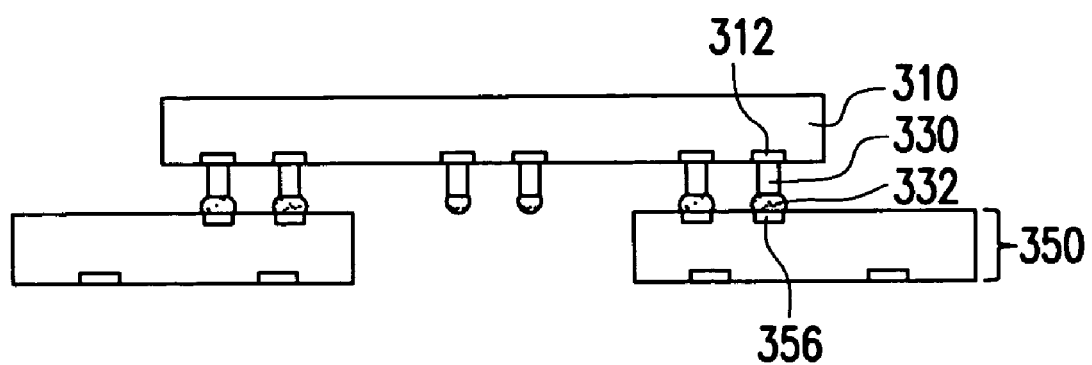

The connecting process of the chip and the substrate is performed. For example, a reflow process is performed to connect the conductive connecting material 332 at a periphery of the first chip 310 with the terminals 356 of the carrier 350. Thereby, the first chip 310 is mounted and electrically connected to the carrier 350 via the conductive pillars 330 and the conductive connecting material 332 as shown in FIG. 34.

Figure 35:
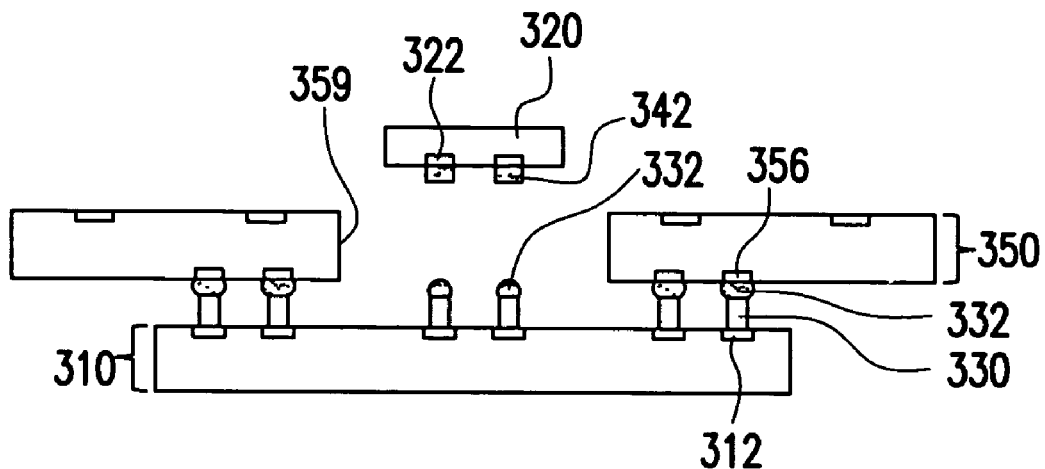
Figure 36:
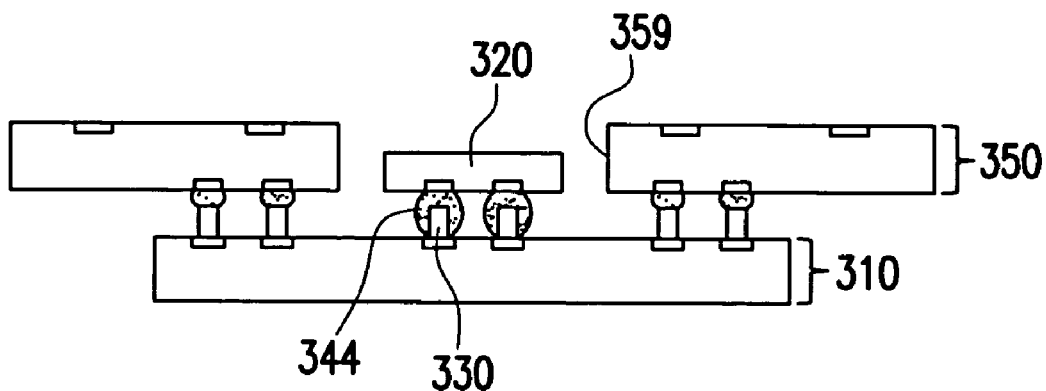

Referring to FIG. 35, a second chip 320 is provided, and a conductive connecting material 342 is formed on the terminals 322 of the second chip 320. Preferably, the melting point of the conductive pillars 330 is higher than the fusion temperature of the conductive connecting material 342. The chip connecting process is then performed. For example, a reflow process is performed to merge the conductive connecting material 342 on the terminal 322 of the second chip 320 and the conductive connecting material 332 on the conductive pillars 330 formed on the central portion of the first chip 310 to form a connecting block 344 which covers the conductive pillars 330 on the central portion of the first chip 310. As shown in FIG. 36, to accommodate the second chip 320 in the opening 359, the second chip 320 is mounted on a central portion of the first chip 310. The first chip 310 and the second chip 320 are electrically connected via the conductive pillars 330 and the connecting block 344. The glue dispensing or injection step is then performed as illustrated in the first and second embodiments.

In the above embodiments, the conductive pillar and the conductive connecting material are used to electrically connect the first chip and the carrier. However, the present invention is not limited to such electric connection. Other method such as wire bonding can also be used for electrically connecting the first chip and the carrier as shown in FIGS. 37 to 42, which illustrate the cross sectional view of the multi-chip package module fabrication in a fourth embodiment of the present invention.

Figure 37:
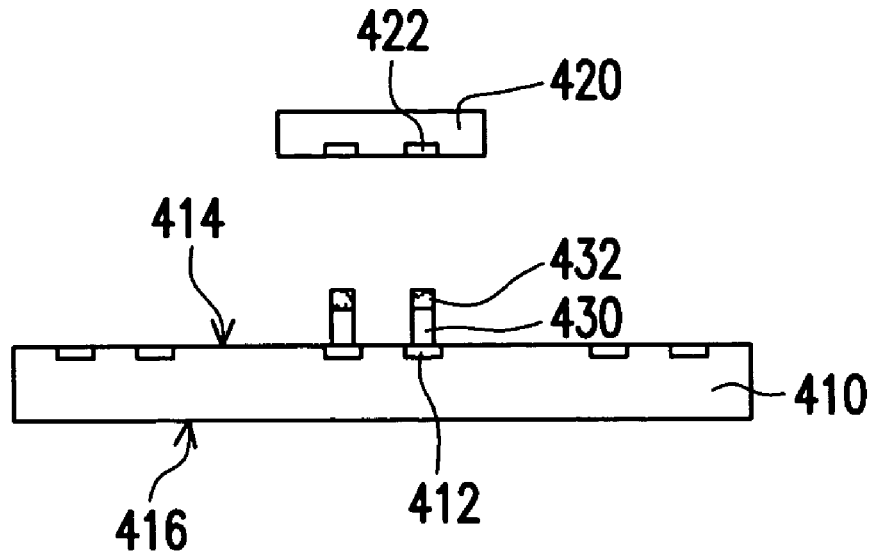
FIGS. 37 to 42 are cross sectional enlarged views showing a fourth example of fabricating a multi-chip package module according to the present invention.

In FIG. 37, a first chip 410 and a second chip 420 are provided. The first chip 410 has an active surface 414 and a rear surface 416 opposing to the active surface 414. The first chip 410 has a plurality of terminals 412 formed on the active surface 414. A plurality of conductive pillars 430 is formed on the terminals 412 of the active surface 414 of the first chip 410. A conductive connecting material 432 is formed on the conductive pillars 430. The method for forming the conductive pillars 430 and the conductive connecting material 432 is incorporated by reference to the Chinese Patent Application Nos. 90104979 and 91100092. The melting point of the conductive pillars 430 is higher than the fusion temperature of the conductive connecting material 432.

Figure 38:
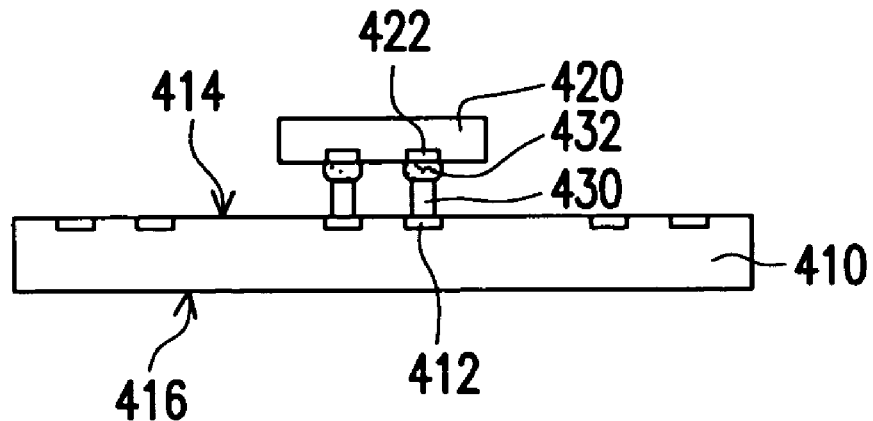

The connecting process between the chips is performed. For example, a reflow process is performed to connect the terminals 422 of the second chip 420 to the conductive connecting material 432 on the conductive pillars 430 on the central portion of the first chip 410. The second chip 420 can thus be mounted to the central portion of the first chip 410. The first chip 410 can thus be electrically connected to the second chip 420 via the conductive pillars 430 and the conductive connecting material 432 as shown in FIG. 38.

Figure 39:
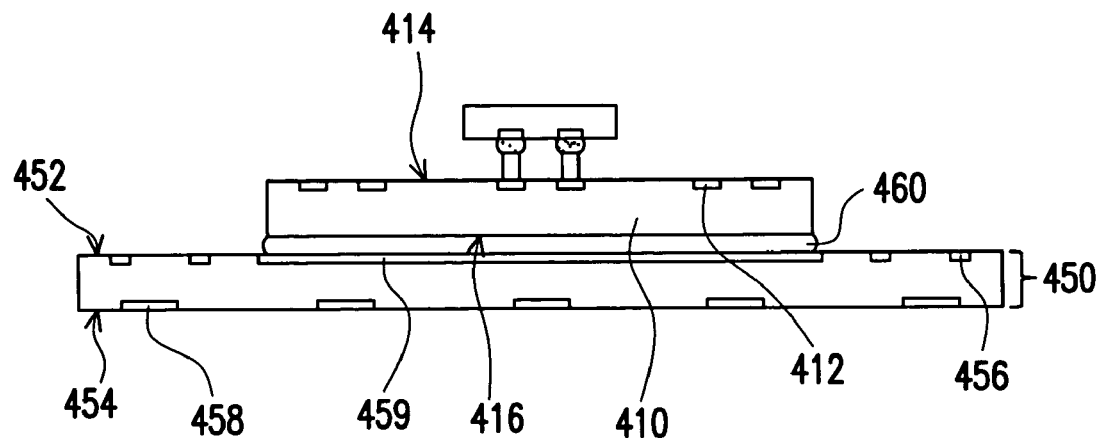

Referring to FIG. 39, a carrier 450 such as a substrate or a ceramic substrate is provided. The carrier 450 has a surface 452 and a rear surface 454 opposing to the surface 452. The carrier 450 has a chip frame 459, multiple terminals 456 and 458. The chip frame 459 and the terminals 456 are exposed at the surface 452, while the terminals 458 are exposed at the rear surface 454. For example, the terminals 456 are formed in two rows at a periphery of the chip frame 459, while the terminals 458 are formed in an array on the rear surface 454. An adhesive material 460 is then used to adhere the rear surface 416 of the first chip 410 to the chip frame 459 of the carrier 450.

Figure 40:
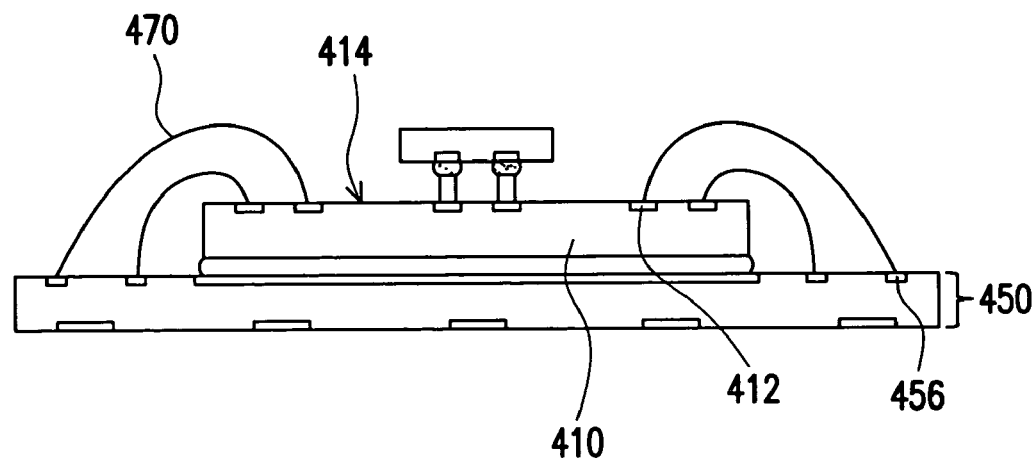

The first chip 410 and the carrier 450 are electrically connected via wire bonding. The wire 470 has one end connected to one of the terminals 412 at the periphery of the active surface 414 of the first chip 410, and the other end connected to one of the terminals 456 as shown in FIG. 40.

Figure 41:
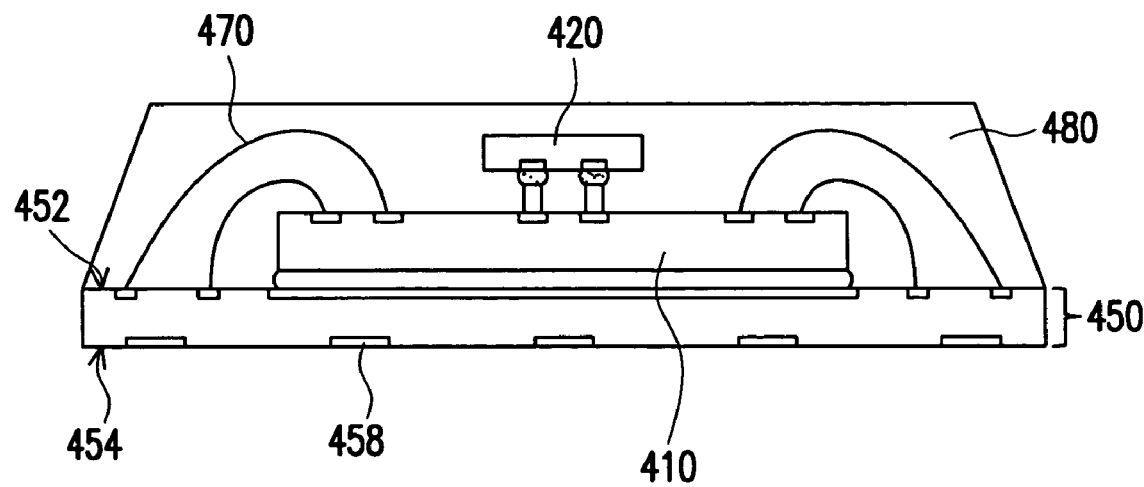
Figure 42:
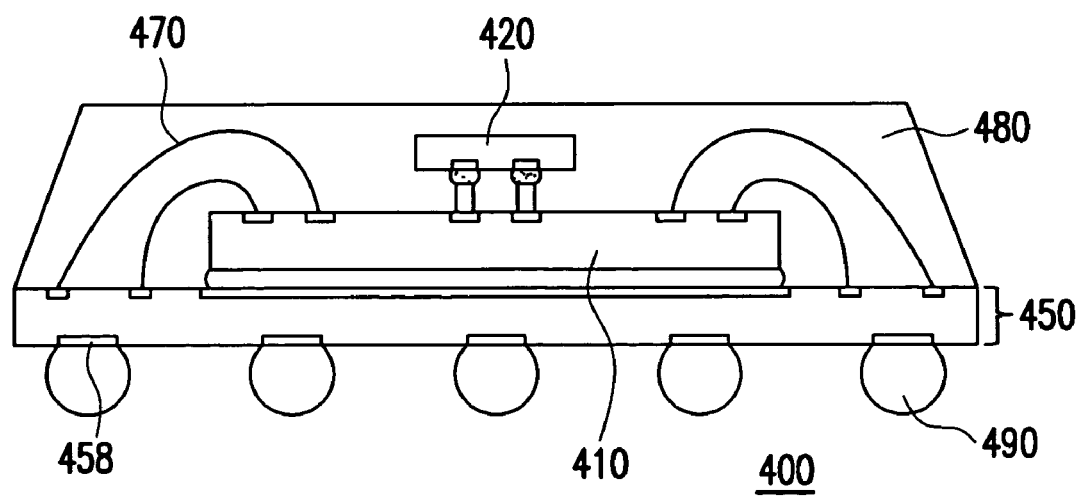

An encapsulating material 480 is formed by injection to cover the first chip 410, the second chip 420, the wire 470 and the surface 452 of the carrier 450. The encapsulating material 480 fills the space between the first chip 410 and the second chip 420 as shown in FIG. 41. A plurality of solder balls 490 is then formed using ball planting on the terminals 458 of the rear surface 454 of the carrier 450 as shown in FIG. 42. The multi-chip package module is thus fabricated. The electric connection between the multi-chip package module and an external circuit (not shown) is established via the solder balls 390.

Figure 43:
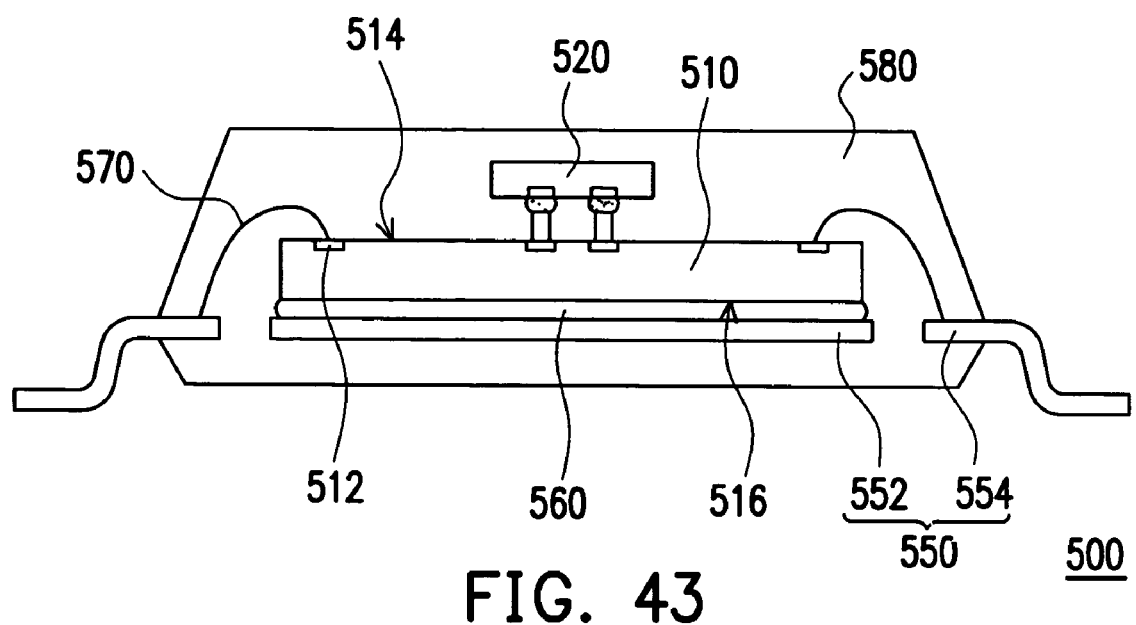
FIG. 43 is a cross sectional enlarged view showing a fifth example of fabricating a multi-chip package module according to the present invention.

In the above embodiments, the carrier includes a substrate or a ceramic substrate. However, the present invention is not limited thereto. The carrier also includes a leadframe as shown in FIG. 43, which illustrates the multi-chip package module in a fifth embodiment of the present invention. The carrier 550 includes a chip frame 552 and multiple leads 554 surrounding the chip frame 552. In this embodiment, the first chip 510 and the second chip 520 are connected before connecting to the carrier. An adhesive 560 is used to adhere the rear surface 516 of the first chip 510 to the chip frame 552 of the carrier 550. The first chip 510 is then electrically connected to the leads 554 of the leadframe 550 via wire bonding. The wires 570 have one ends connected to the terminals 512 at the periphery of the active surface 514 of the first chip, and the other ends connected to one ends of the leads 554. A encapsulating material 580 is formed by injection to cover the first chip 510, the second chip 520, the wires 570, the chip frame 552 of the carrier 550, and the ends of the leads 554 near the chip frame 552. The encapsulating material 580 also fills the space between the first chip 510 and the second chip 520. A trimming and forming process is then performed to cut the dam bar exposed between the leads 554 of the encapsulating material 580. The exposed portions of the leads 554 are then bent into the gull wing type as shown in FIG. 34. The electrical connection between the multi-chip package module and an external circuit is thus established via the leads 554 of the carrier 550.

Figure 44:
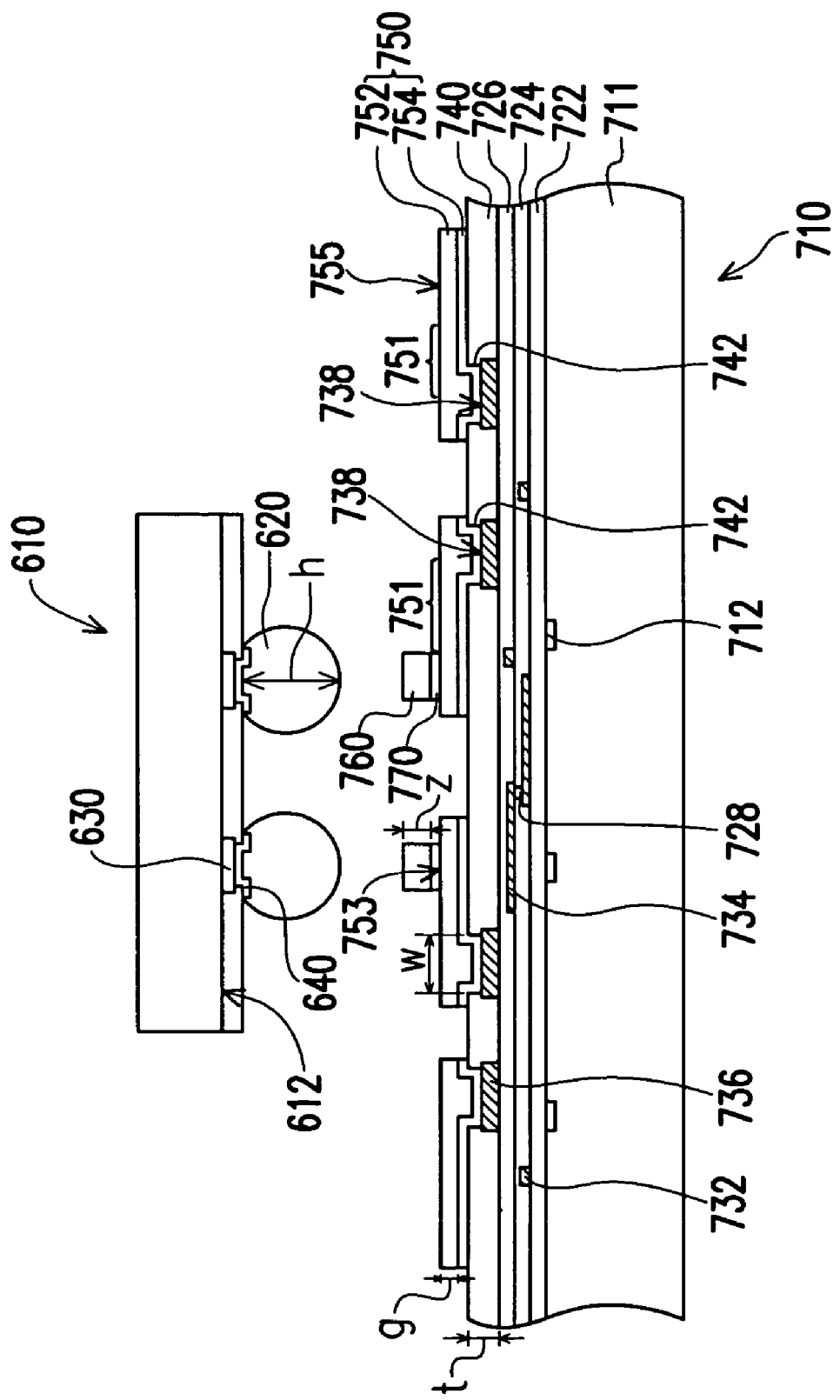
FIGS. 44 and 45 show the method of assembling chips according to an embodiment of the present invention.
Figure 45:
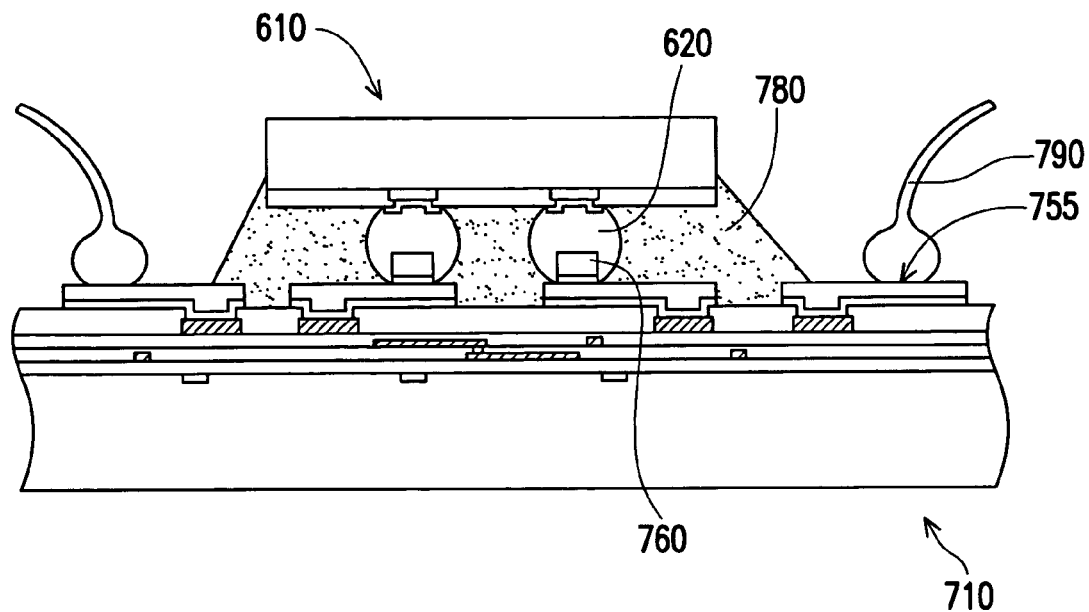

Referring to FIG. 44 and 45, showing the method of assembling chips according to an embodiment of the present invention, there are two chips 610, 710 bonded using a flip-chip technology. In FIG. 44, the chip 610 is provided with bumps 620 shaped like balls. The chip 610 has multiple metal contacts 630 formed on an active surface 612 of the chip 610. An under-bump-metallurgy (UBM) layer 640 is formed on the metal contacts 630. The under-bump-metallurgy layer 640 can be a single-layer structure or a multi-layer structure made of one or several of the materials selected from copper, nickel and gold. For example, the under-bump-metallurgy layer 640 can be constructed, stacking from the bonding pads, from a titanium layer and a copper layer, or a titanium layer, a copper layer and a nickel layer, or a titanium layer, a copper layer, a nickel layer and a gold layer, or a titanium-tungsten-alloy layer and a gold layer, or a chromium layer, a copper layer and a nickel layer.

The bumps 620 are formed on the under-bump-metallurgy layer 640. The bumps 620 have a height h larger than 15 microns, for example. The material constituting the bumps 620 comprises a tin-lead alloy, a tin-silver alloy, a tin-silver-copper alloy, a tin-bismuth alloy, a tin-silver-indium alloy, a tin-bismuth-zinc alloy, a tin-zinc alloy, a tin-bismuth-silver-copper alloy, a tin-silver-copper-antimony alloy, a tin-antimony alloy or a tin-zinc-indium-silver alloy.

The chip 710 has multiple electronic devices 712, such as transistors or MOS devices, formed on a surface of a semiconductor substrate 711, wherein the semiconductor substrate 711 is, for example, silicon. Multiple dielectric layers 722, 724, and 726 are stacked on the semiconductor substrate 711 and have a plurality of via holes 728 (only shown one of them). Multiple fine-line interconnection layers 732, 734, and 736 are disposed on the dielectric layers 722, 724, and 726, respectively, and the circuit layer 736 has multiple original pads 738. The fine-line interconnection layers 732, 734, and 736 are electrically connected with each other through the via holes 728 and are electrically connected to the electronic devices 712. The fine-line interconnection layers 732, 734, and 736 are formed, for example, by depositing aluminum or an aluminum alloy using a PVD process or by depositing copper or a copper alloy using electroplating processes and damascene processes.

A passivation layer 740 is formed over the dielectric layers 722, 724, and 726 and over the circuit layers 732, 734 and 736. The passivation layer 740 has a thickness t, for example, larger than 0.35 micrometers. It should be noted that the passivation layer 740 should have enough thickness to prevent moisture, impurities, mobile ions or transitional metal elements from penetrating therethrough. The passivation layer 740 can be a silicon-dioxide layer, a silicon-nitride layer, a phosphosilicate glass (PSG) layer, a silicon-oxynitride layer or a composite structure comprising the above-mentioned layers. The passivation layer 740 has openings 742 exposing the original pads 738. The openings 742 have a width larger than about 0.1 µm, for example.

The chip 710 further comprises a post-passivation metal scheme 750 formed over the passivation layer 740. The post-passivation metal scheme 750 comprises a gold layer 752 and an adhesion/barrier layer 754, wherein the gold layer 752 is positioned over the adhesion/barrier layer 754. The gold layer 752 has a thickness g larger than 1 micron and can be formed by electroplating. The adhesion/barrier layer 754 comprises a titanium-tungsten alloy, titanium, titanium-nitride or tantalum-nitride. The post-passivation metal scheme 750 comprises redistribution transition lines 751, a plurality of bump pads 753 and a plurality of wire-bonding pads 755, and the redistribution transition lines 751 connects the bump pads 753 or the wire-bonding pads 755 to the original pads 738.

After the post-passivation metal scheme 750 is formed over the passivation layer 740, multiple connecting pads 760 are formed over the bump pads 753, wherein the connecting pads 760 have a height z larger than 3 microns, for example. An under-bump-metallurgy (UBM) layer 770 can be formed between the connecting pads 760 and the bump pads 753. The material constituting the connecting pads 760 comprises a high lead solder, a tin-lead alloy, a tin-silver alloy, a tin-silver-copper alloy, a tin-bismuth alloy, a tin-silver-indium alloy, a tin-bismuth-zinc alloy, a tin-zinc alloy, a tin-bismuth-silver-copper alloy, a tin-silver-copper-antimony alloy, a tin-antimony alloy or a tin-zinc-indium-silver alloy.

Figure 44A:
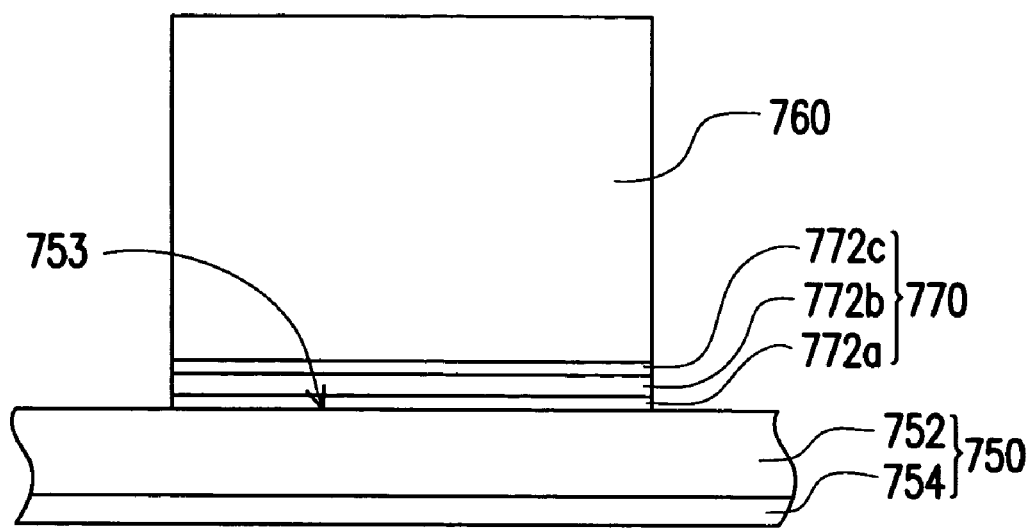
FIGS. 44A, 44B and 44C show constructions of forming a conductive pillar and an under-bump-metallurgy layer over a bump pad.
Figure 44B:
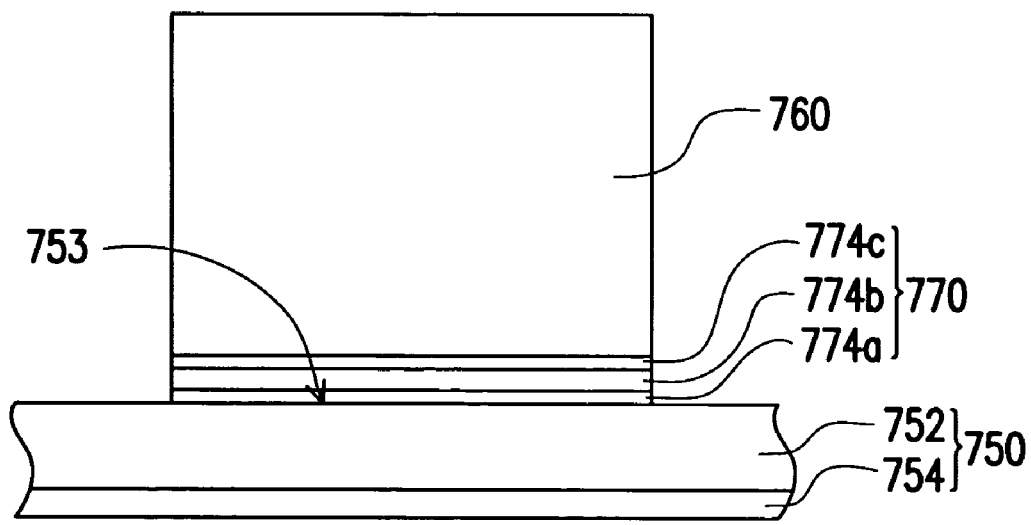
Figure 44C:
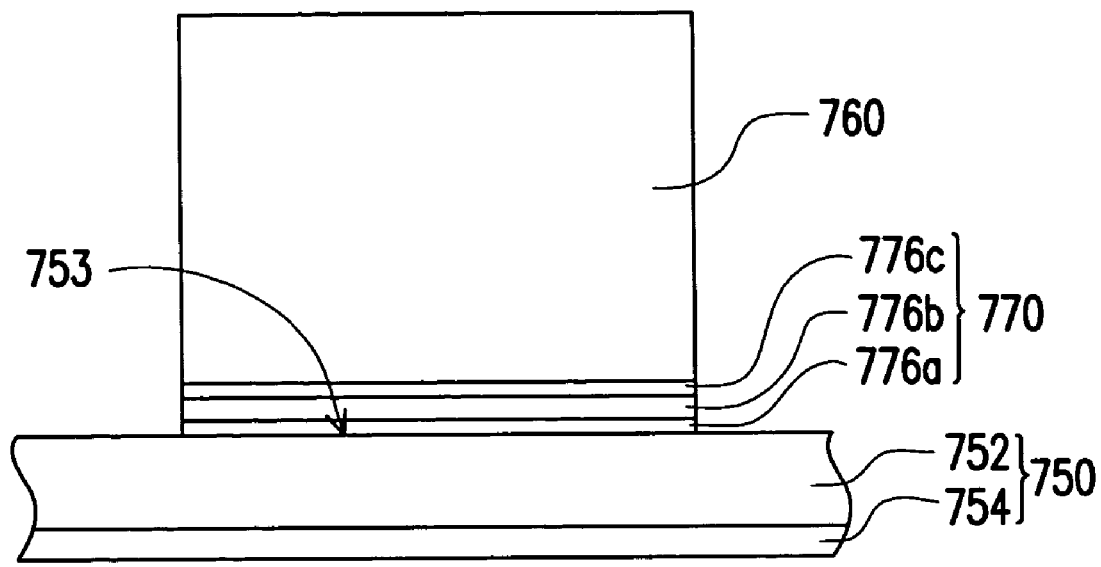

The under-bump-metallurgy layer 770 can be a multilayer structure, as shown in FIGS. 44A, 44B and 44C. In FIG. 44A, the under-bump-metallurgy layer 770 comprises a titanium layer 772a, a copper layer 772b and a nickel layer 772c. The titanium layer 772a is positioned on the bump pads 753; the copper layer 772b is positioned on the titanium layer 772a; the nickel layer 772c is positioned on the copper layer 772b; the connecting pads 760 are formed on the nickel layer 772c. In FIG. 44B, the under-bump-metallurgy layer 770 comprises a titanium-tungsten-alloy layer 774a, a copper layer 774b and a nickel layer 774c. The titanium-tungsten-alloy layer 774a is positioned on the bump pads 753; the copper layer 774b is positioned on the titanium-tungsten-alloy layer 774a; the nickel layer 774c is position on the copper layer 774b; the connecting pads 760 are formed on the nickel layer 774c. In FIG. 44C, the under-bump-metallurgy layer 770 comprises a chromium layer a nickel layer 776c. The chromium layer 776a is positioned on the bump pads 753; the copper layer 776b is positioned on the chromium layer 776a; the nickel layer 776c is positioned on the copper layer 776b; the connecting pads 760 are formed on the nickel layer 776c.

After the bumps 620 are formed on the chip 610 and the connecting pads 760 are formed on the chip 710, a reflow process can be performed to joint the bumps 620 with the connecting pads 760, as shown in FIG. 45. Thereafter, an underfill 780 is filled between the chips 610 and 710 and covers the bumps 620. A wire-bonding process can be performed to form multiple wires 790 connecting the wire-bonding pads 755 to an external circuit, such as circuit substrate.

Figure 46:
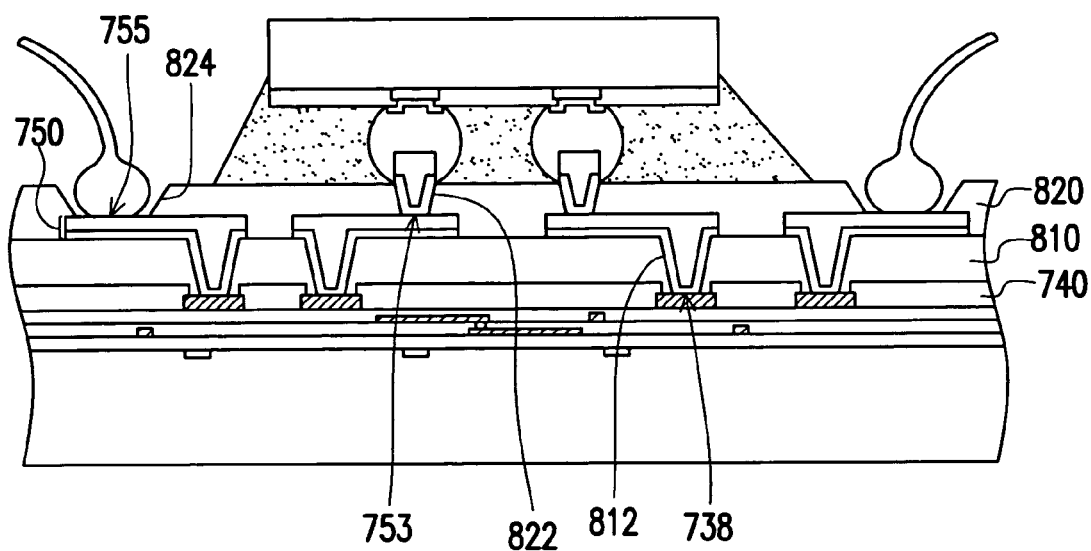
FIGS. 46 and 47 show the structure of assembling chips according to other embodiments of the present invention.

The same reference numerals are used throughout FIGS. 44, 45, 46, 47 and 48 to designate the same or similar elements. FIG. 46 shows the method of assembling chips according to another embodiment of the present invention. Polymer layers 810 and 820 are made of, for example, polyimide, benzocyclobutene, porous dielectric material, parylene, or elastomer. The polymer layer 810 is formed between the circuit layer 750 and the passivation layer 740 and has a plurality of via-holes 812, through which the circuit layer 750 is connected to the original pads 738. The polymer layer 820 is formed on the circuit layer 750 and has a plurality of openings 822 and 824 exposing the bump pads 753 and the wire-bonding pads 755, respectively.

Figure 47:
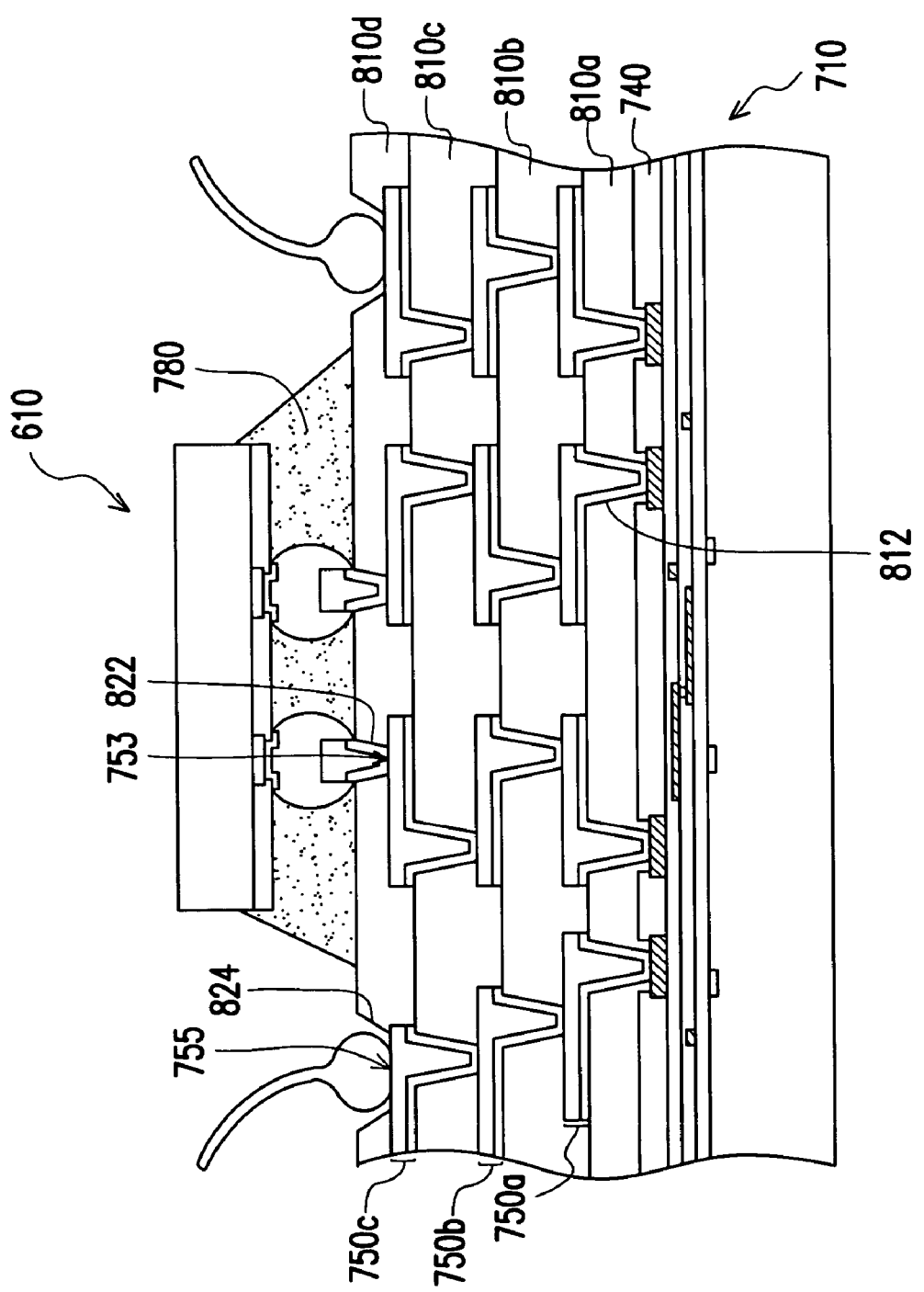

There can be multiple circuit layers 750a, 750b, 750c formed on the passivation layer 740, as shown in FIG. 47. FIG. 47 shows the method of assembling chips according to another embodiment of the present invention. A polymer layer 810a is formed between the circuit layer 750a and the passivation layer 740. Polymer layers 810b and 810c are formed between the circuit layers 750a, 750b, 750c. A polymer layer 810d is formed on the circuit layer 750c. The polymer layer 810a, 810b, 810c, 810d are made of polyimide, benzocyclobutene, porous dielectric material, parylene, or elastomer.

Figure 48:
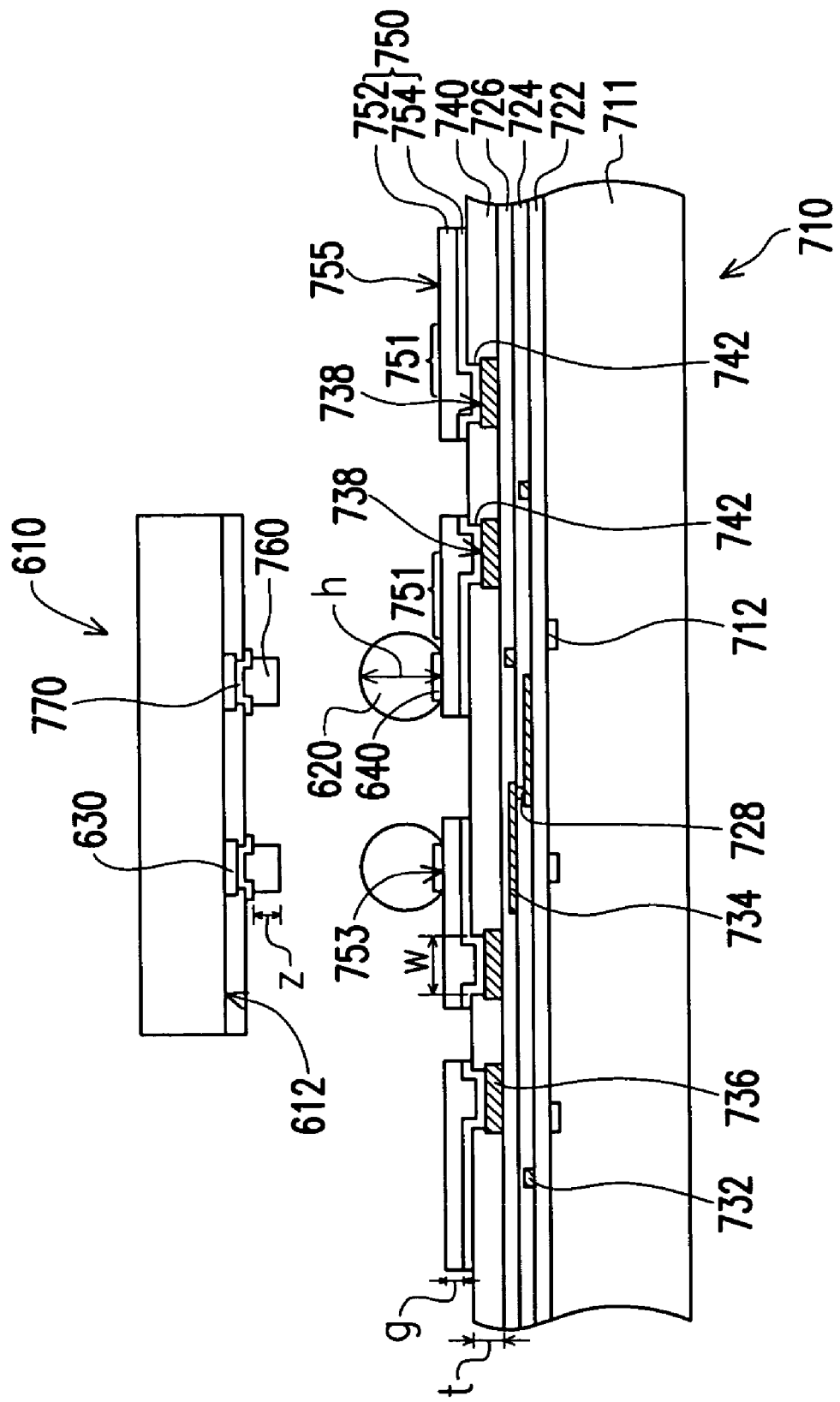
FIG. 48 shows the method of assembling chips according to another embodiment of the present invention.

FIG. 48 shows the method of assembling chips according to another embodiment of the present invention. Bumps 620 are formed on the chip 710, while connecting pads 760 are formed on the chip 610. An under-bump-metallurgy layer 640 can be formed between the gold layer 752 and the bumps 620. An under-bump-metallurgy layer 770 can be formed between the metal contacts 630 and the connecting pads 760. The material and the construction of the bumps 620, connecting pads 760 and under-bump-metallurgy layers 640 and 770 can be referred to the elements with the same reference number in the above description. The bumps 620 have a height h larger than 15 microns, for example.

Accordingly, the present invention has the following advantages.

1. As the melting point of the conductive pillars is higher than the fusion temperature of the conductive connecting material, such that the conductive pillar will not be melted during the reflow process. The distance between the first and second chips can thus be maintained thereby, allowing the encapsulating material to fill the space between the first and second chips in the subsequent process.

2. The conductive pillars are supported by the conductive connecting material on the second chip with surface contact, so that the sliding motion between the conductive pillars and the conductive connecting material on the second chip is suppressed. The first and second chips can thus be connected with precise alignment to avoid short circuit.

3. The conductive connecting material on the conductive pillars is supported by the second chip or by the conductive connecting material on the second chip with a surface contact, so that the sliding motion is suppressed. The first and second chips can thus be connected with precise alignment to avoid short circuit.

4. Unleaded material can be used for forming the conductive pillars and the conductive connecting material for environmental concern.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A multi-chip structure comprising:
   a first chip comprising a first pad comprising a first gold layer, a metal layer over said first gold layer, a copper layer over said metal layer, and a nickel layer over said copper layer;
   a second chip; and
   a tin-containing material connecting said first pad to said second chip.

2. The structure of claim 1, wherein said first pad further comprises a second gold layer over said nickel layer.

3. The structure of claim 1, wherein said tin-containing material further comprises copper.

4. The structure of claim 1 further comprising a wire wirebonded to a second pad of said first chip.

5. The structure of claim 1, wherein said tin-containing material further comprises lead.

6. The structure of claim 1, wherein said tin-containing material further comprises silver.

7. A multi-chip structure, comprising:
   a first chip comprising:
     a semiconductor substrate comprising multiple MOS devices,
     a metallization structure over said semiconductor substrate,
     a passivation layer over said metallization structure, an opening in said passivation layer exposing a top surface of a first pad of said metallization structure, and
     a second pad connected to said top surface of said first pad, wherein said second pad comprising a copper layer and a nickel layer over said copper layer;
   a second chip over said first chip; and
   a tin-containing material on said nickel layer, wherein said tin-containing material connects said second pad to said second chip.

8. The structure of claim 7, wherein said second pad further comprises a gold layer over said nickel layer.

9. The structure of claim 7, wherein said tin-containing material further comprises copper.

10. The structure of claim 7, wherein said second pad further comprises a gold layer under said copper layer.

11. The structure of claim 7, wherein said second pad comprises an electroplated metal.

12. The structure of claim 7 further comprising a wire wirebonded to a third pad of said first chip.

13. The structure of claim 7, wherein said tin-containing material further comprises lead.

14. The structure of claim 7, wherein said tin-containing material further comprises silver.

15. A multi-chip structure, comprising:
   a first chip comprising:
     a semiconductor substrate comprising multiple MOS devices,
     a metallization structure an interconnection layer over said semiconductor substrate,
     a passivation layer over said metallization structure, an opening in said passivation layer exposing a first pad of said metallization structure,
     a trace over said passivation layer, and
     a second pad on said trace, wherein said second pad is connected to said first pad through said trace, wherein said second pad comprises a copper layer and a nickel layer over said copper layer;
   a second chip over said first chip; and
   a tin-containing material connecting said second pad to said second chip.

16. The structure of claim 15, wherein said second pad further comprises a gold layer over said nickel layer.

17. The structure of claim 15, wherein said tin-containing material further comprises copper.

18. The structure of claim 15, wherein said tin-containing material further comprises lead.

19. The structure of claim 15, wherein said tin-containing material further comprises silver.

20. The structure of claim 15 further comprising a wire wirebonded to a third pad of said first chip.

21. The structure of claim 1, wherein said tin-containing material covers a top surface and a sidewall of said first pad.

22. The structure of claim 7, wherein said tin-containing material covers a top surface and a sidewall of said second pad.

23. The structure of claim 7, wherein said passivation layer comprises silicon nitride.

24. The structure of claim 15, wherein said tin-containing material covers a top surface and a sidewall of said second pad.

25. The structure of claim 15, wherein said trace comprises a gold layer having a thickness of greater than 1 micron.

26. The structure of claim 15, wherein said passivation layer comprises silicon nitride.

27. The structure of claim 1, wherein said metal layer comprises titanium.

28. The structure of claim 27, wherein said metal layer further comprises tungsten.

29. The structure of claim 1, wherein said metal layer comprises chromium.

30. The structure of claim 1, wherein said first gold layer has a thickness of greater than 1 micron.

31. The structure of claim 1, wherein said first pad further comprises a titanium-containing layer under said first gold layer.

32. The structure of claim 31, wherein said titanium-containing layer further comprises tungsten.

33. The structure of claim 1, wherein said first pad comprises an electroplated metal.

34. The structure of claim 1, wherein said nickel layer is on said copper layer.

35. The structure of claim 1, wherein said tin-containing material is on said nickel layer.

36. The structure of claim 7, wherein said passivation layer has a thickness of greater than 0.35 microns.

37. The structure of claim 7, wherein said first pad comprises aluminum.

38. The structure of claim 7, wherein said first pad comprises electroplated copper.

39. The structure of claim 7, wherein said semiconductor substrate comprises silicon.

40. The structure of claim 10, wherein said gold layer has a thickness of greater than 1 micron.

41. The structure of claim 10, wherein said second pad further comprises a titanium-containing layer under said gold layer.

42. The structure of claim 41, wherein said titanium-containing layer comprises tungsten.

43. The structure of claim 7, wherein said nickel layer is on said copper layer.

44. The structure of claim 7, wherein said second pad comprises a titanium-containing layer under said copper layer.

45. The structure of claim 44, wherein said titanium-containing layer comprises tungsten.

46. The structure of claim 7, wherein said second pad comprises a chromium-containing layer under said copper layer.

47. The structure of claim 15, wherein said passivation layer has a thickness of greater than 0.35 microns.

48. The structure of claim 15, wherein said first pad comprises aluminum.

49. The structure of claim 15, wherein said first pad comprises electroplated copper.

50. The structure of claim 15, wherein said semiconductor substrate comprises silicon.

51. The structure of claim 15, wherein said trace comprises a titanium-containing layer and a gold layer over said titanium-containing layer.

52. The structure of claim 51, wherein said titanium-containing layer comprises tungsten.

53. The structure of claim 15, wherein said trace comprises gold.

54. The structure of claim 15 further comprising a polymer layer between said trace and said passivation layer.

55. The structure of claim 54, wherein said polymer layer comprises polyimide.

56. The structure of claim 54, wherein said polymer layer comprises benzocyclobutene.

57. The structure of claim 15 further comprising a polymer layer on said trace.

58. The structure of claim 57, wherein said polymer layer comprises polyimide.

59. The structure of claim 57, wherein said polymer layer comprises benzocyclobutene.

60. The structure of claim 15 further comprising a polymer layer and first and second patterned metal layers over said passivation layer, wherein said polymer layer is between said first and second patterned metal layers, said first and second patterned metal layers comprises said trace.

61. The structure of claim 60, wherein said polymer layer comprises polyimide.

62. The structure of claim 60, wherein said polymer layer comprises benzocyclobutene.

63. The structure of claim 15, wherein said trace comprises an electroplated metal.

64. The structure of claim 15, wherein said nickel layer is on said copper layer.

65. The structure of claim 15, wherein said second pad comprises a titanium-containing layer under said copper layer.

66. The structure of claim 65, wherein said titanium-containing layer comprises tungsten.

67. The structure of claim 15, wherein said second pad comprises a chromium-containing layer under said copper layer.

68. The structure of claim 15, wherein said tin-containing material is on said nickel layer.

69. The structure of claim 15, wherein said trace has a sidewall separated from said passivation layer.

70. The structure of claim 20, wherein said third pad comprises a gold layer.

71. The structure of claim 70, wherein said gold layer has a thickness of greater than 1 micron.

72. The structure of claim 70, wherein said third pad further comprises a titanium-containing layer under said gold layer.

73. The structure of claim 72, wherein said titanium-containing layer comprises tungsten.

74. The structure of claim 20, wherein said third pad has a same material as said trace.

75. The structure of claim 4, wherein said second pad comprises a second gold layer.

76. The structure of claim 75, wherein said second gold layer has a thickness of greater than 1 micron.

77. The structure of claim 75, wherein said second pad further comprises a titanium-containing layer under said second gold layer.

78. The structure of claim 77, wherein said titanium-containing layer comprises tungsten.

79. The structure of claim 12, wherein said third pad comprises a gold layer.

80. The structure of claim 75, wherein said gold layer has a thickness of greater than 1 micron.

81. The structure of claim 75, wherein said third pad further comprises a titanium-containing layer under said gold layer.

82. The structure of claim 77, wherein said titanium-containing layer comprises tungsten.

* * * * *

UNITED STATES PATENT AND TRADEMARK OFFICE
CERTIFICATE OF CORRECTION

PATENT NO.        : 7,242,099 B2                                          Page 1 of 1
APPLICATION NO.   : 10/695,630
DATED             : July 10, 2007
INVENTOR(S)       : Shih-Hsiung Lin et al.

It is certified that error appears in the above-identified patent and that said Letters Patent is hereby corrected as shown below:

Col. 16, line 17;
In claim 15, line 5, delete "an interconnection layer"

Signed and Sealed this

Twenty-fifth Day of November, 2008

JON W. DUDAS
*Director of the United States Patent and Trademark Office*